United States Patent [19]

Gray

[11] Patent Number: 5,214,582
[45] Date of Patent: May 25, 1993

[54] INTERACTIVE DIAGNOSTIC SYSTEM FOR AN AUTOMOTIVE VEHICLE, AND METHOD

[75] Inventor: Moshe Gray, Los Altos Hills, Calif.

[73] Assignee: Edge Diagnostic Systems, Sunnyvale, Calif.

[21] Appl. No.: 647,774

[22] Filed: Jan. 30, 1991

[51] Int. Cl.$^5$ .................. G01M 15/00; G06F 11/00
[52] U.S. Cl. .................. 364/424.03; 364/431.11; 364/551.01; 73/117.3
[58] Field of Search ............. 364/42.03, 42.04, 431.11, 364/578, 551.01; 73/117.2, 117.3

[56] References Cited

U.S. PATENT DOCUMENTS

| | | | |
|---|---|---|---|
| 4,300,205 | 11/1981 | Tansuwan | 364/578 |
| 4,757,463 | 7/1988 | Ballou et al. | 364/551.01 |
| 4,796,206 | 1/1989 | Boscove et al. | 364/431.01 |
| 4,862,371 | 8/1989 | Maekawa | 364/431.11 |
| 5,003,477 | 3/1991 | Abe et al. | 364/424.03 |
| 5,041,976 | 8/1991 | Marko et al. | 364/424.03 |
| 5,077,670 | 12/1991 | Takai et al. | 364/424.03 |

Primary Examiner—Thomas G. Black
Attorney, Agent, or Firm—Ware & Freidenrich

[57] ABSTRACT

An interactive diagnostic system is disclosed herein for use with an automotive vehicle of the type including a network of sensors and actuators for independently sensing and actuating a number of different functions within the vehicle and an onboard computer for monitoring the sensors and controlling the operation of the actuators. This system provides the automotive service professional with all of the tools necessary to provide precision diagnostic testing on todays computer-controlled cars. This is accomplished by providing the system with means including an external computer for controlling operation of one or more specific actuators independent of the onboard computer and for simulating the operation of specific sensors independent of the actual operation of these latter sensors. At the same time, the electronic data entering and exiting the onboard computer including the actual data associated with the network of sensors and actuators can be continuously monitored and analyzed by the external computer. In this way, the automotive service professional is able to quickly and easily test and trouble shoot the performance of a vehicle's onboard computer and engine electronics down to the component level including specifically its entire network of sensors and actuators.

32 Claims, 5 Drawing Sheets

(System Overview)

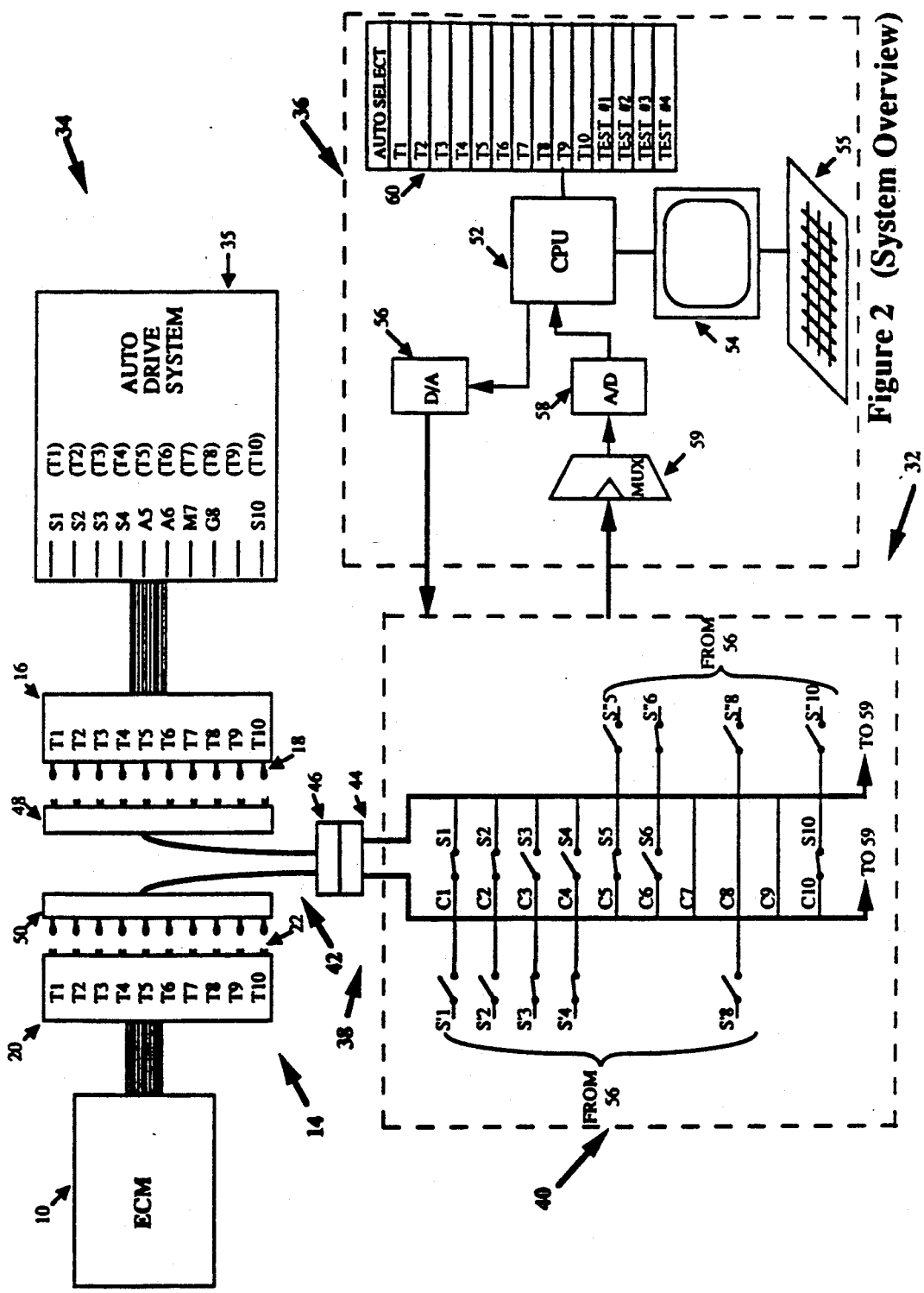
Figure 2 (System Overview)

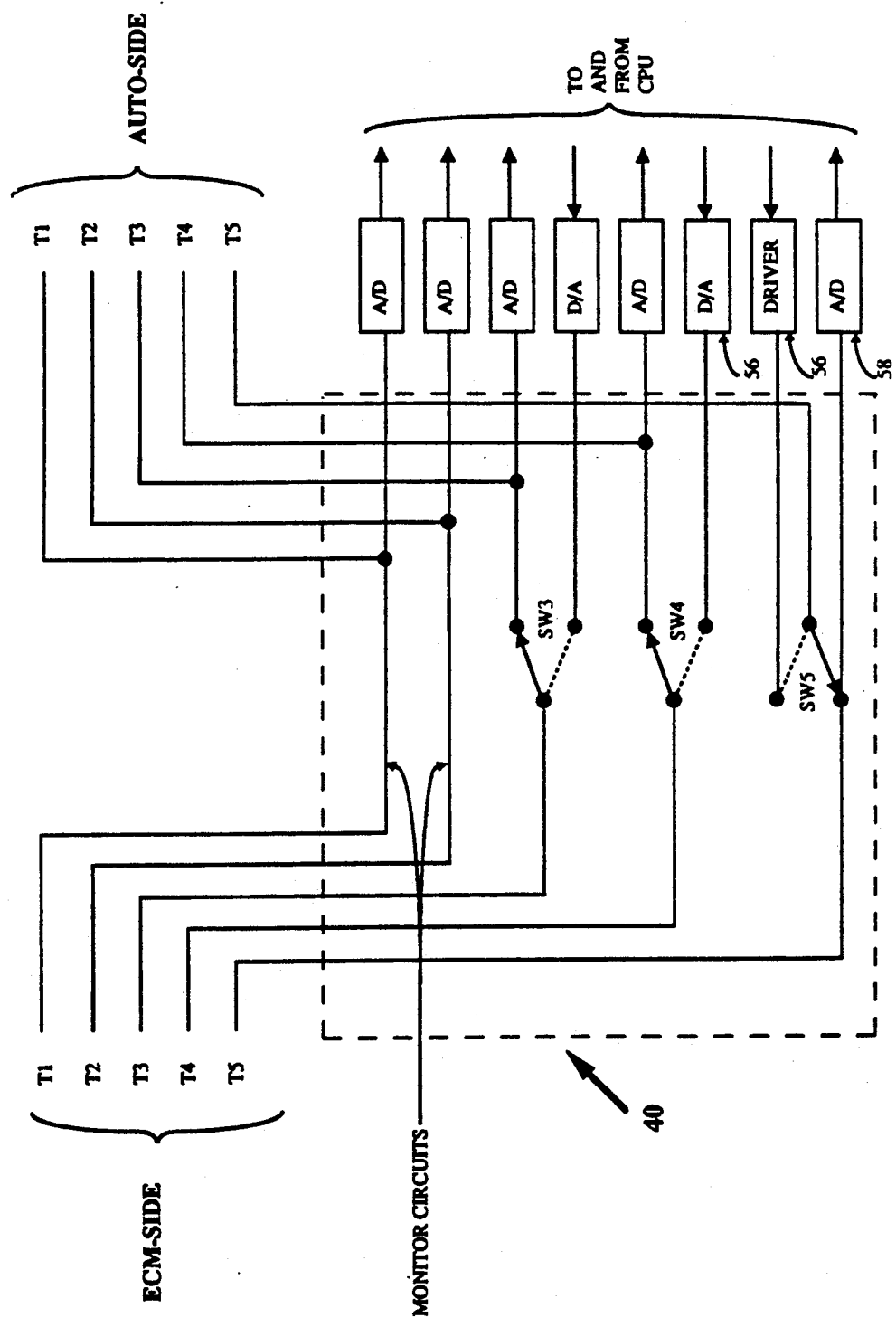
Figure 3 (Bypass Circuitry)

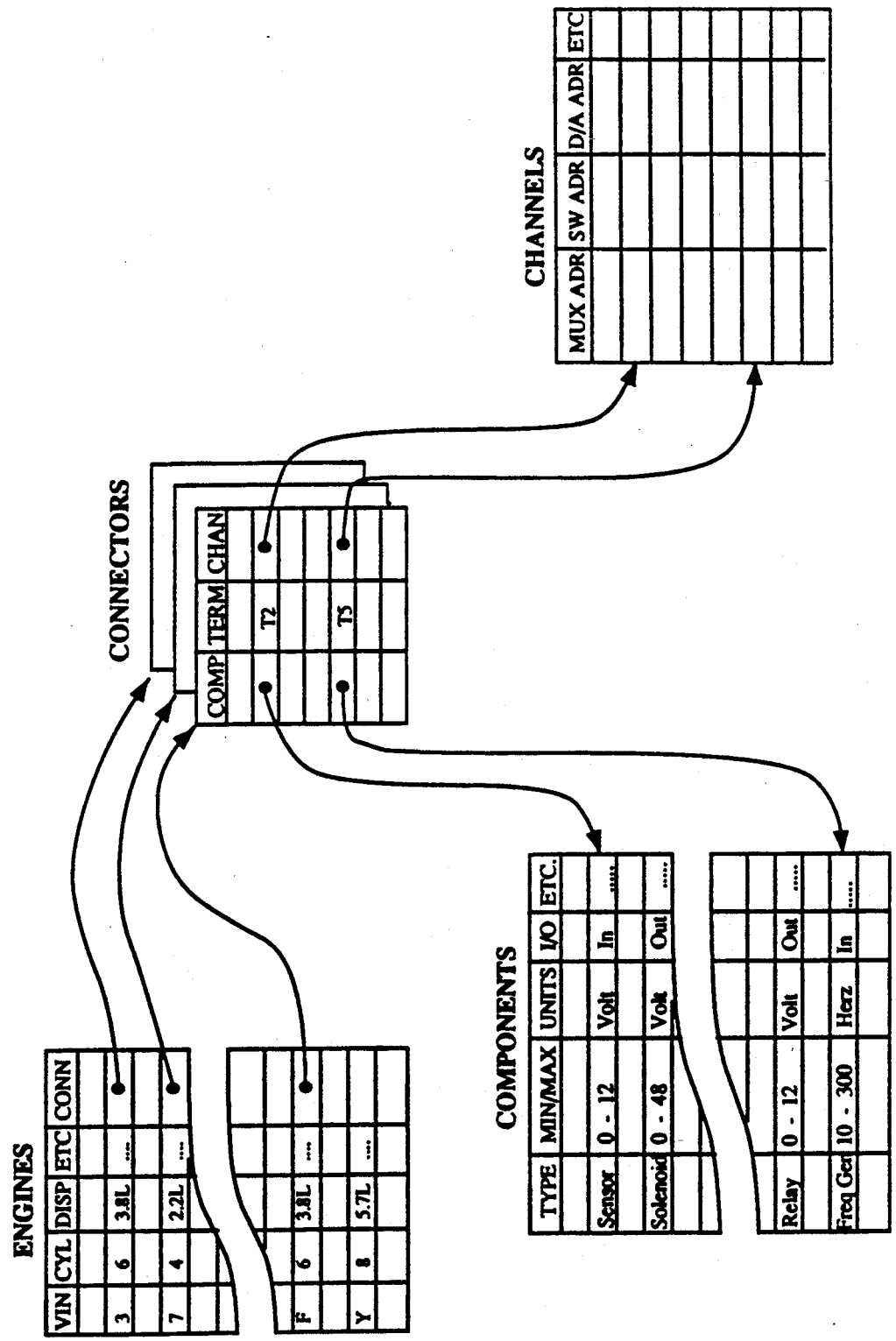
Figure 4 (Database Organization)

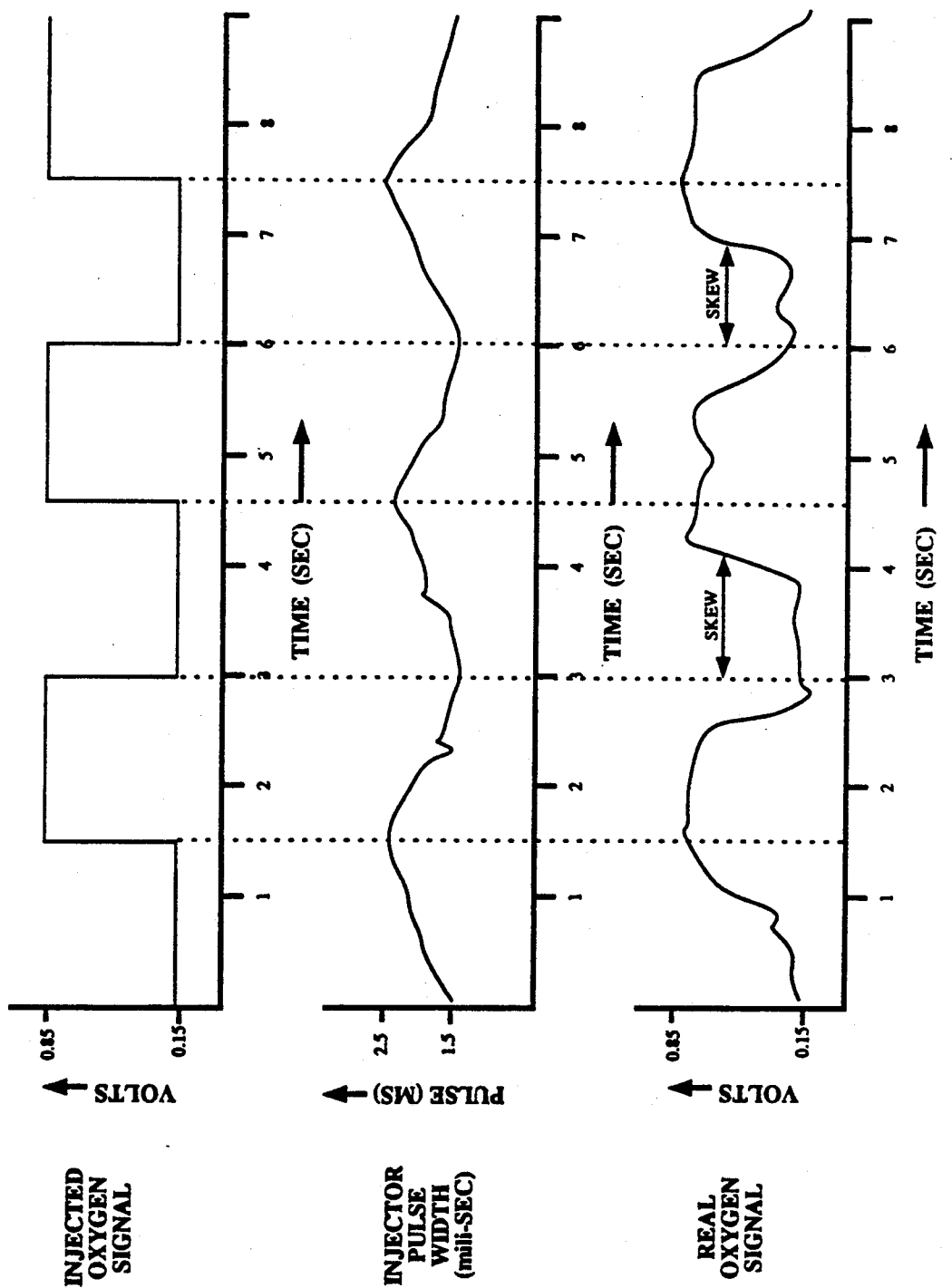
Figure 5 (Oxygen Bypass Test)

INTERACTIVE DIAGNOSTIC SYSTEM FOR AN AUTOMOTIVE VEHICLE, AND METHOD

BACKGROUND OF THE INVENTION

The present invention relates generally to a diagnostic system for an automotive vehicle of the type having (1) a network of sensors and actuators for independently sensing and actuating a number of different functions within the vehicle and (2) an onboard computer for monitoring the sensors and controlling the operation of the actuators. The present invention relates more particularly to what may be referred to as an interactive system for diagnosing the performance of a vehicle (1) by controlling the operation of one or more of its specific actuators independent of its onboard computer, (2) by simulating the operation of one or more of its specific sensors independent of the actual operation of those sensors, and (3) by continuously monitoring and analyzing the other vehicle actuators and sensors and, in fact, all of the electronic data entering and/or exiting the onboard computer, preferably, in real time.

It is a fact that most new cars and trucks, that is, automotive vehicles generally, are far more sophisticated than their predecessors. As exemplified in FIG. 1, a typical vehicle manufactured today, generally indicated at 8, includes an onboard computer 10 which is generally referred to as an electronic control module. This ECM serves to control the operation of one or more specific actuators associated with the vehicle's auto drive system 12 including its engine and other components by responding to the network of corresponding sensors. Typical actuators which are usually solenoids, although not always, might include fuel injectors, an air diverter valve, an ignition module, valves associated with anti-lock brakes, as well as others, some of which are illustrated in FIG. 1. Typical sensors may include temperature sensors, oxygen level sensors, sensors associated with anti-lock brakes and so on, some of which are also illustrated in FIG. 1. The way in which these components interrelate with one another and with the electronic control module may be best exemplified by the way in which fuel injection is controlled as a function of oxygen levels within the engine. More specifically, the ECM uses an oxygen sensor in the exhaust manifold to sense the oxygen level there and, at the same time, it operates the fuel injector through an associated solenoid. Thus, if the ECM senses an increase in oxygen, it will automatically increase fuel consumption by appropriately operating the fuel injection solenoid and, if it senses a decrease in oxygen, it will automatically decrease fuel consumption by means of the same solenoid, thus achieving optimal emission levels.

Still referring to FIG. 1, a typical arrangement 14 for electrically connecting the ECM 10 with its network of actuators and sensors 12 is illustrated. This connection arrangement includes an auto-side connector 16 having a series of auto-side plug-in terminals 18 respectively connected with associated sensors and actuators and a computer-side connector 20 disengageably connectable to the auto-side connector by means of corresponding, complementary computer-side plug-in terminals 22 connected to the appropriate circuitry within electronic control module 10. In the embodiment illustrated in FIG. 1, the auto-side terminals 18 are shown as the male terminals and the computer-side terminals 22 are shown as female terminals. For purposes of clarity, cooperating terminals 18, 22 are designated T1, T2, T3 and so on. Only ten such terminals have been illustrated for purposes of convenience but in today's vehicles, there can be as may as 100 such terminals. The components connected with these terminals vary between different vehicle makes and models. For example, the oxygen sensor might be associated with terminal T1 in one vehicle and T5 in another. Vehicle makes and models may include sensors and actuators that other vehicle makes and models do not have. For example, a knock sensor used to sense engine knocks, which result in the ECM retarding spark timing, is found generally only in more expensive cars.

Having described the present-day high tech automotive vehicle, attention is now directed to one prior art way in which it can be serviced. Specifically, the automotive service professional might use what is commonly referred to as a "breakout box", generally indicated by the reference numeral 24, for gaining access to all of the terminals T1-T10. To this end, the breakout box has its own adaptor 26 disposed between and connecting together auto-side connector 16 with computer-side connector 20 such that each terminal 18 remains connected to its associated terminal 22. At the same time, adaptor 26 is connected to the breakout box through a connecting harness 28 for electrically connecting the breakout box's own terminals 30 to corresponding terminals T1, T2, T3 and so on. In this way, the automotive service professional can easily gain access to any of the terminals T1-T10 by means of terminals 30.

In actual practice, the breakout box 24 is typically used by the automotive service professional to diagnose a problem associated with energization of a trouble light on the dashboard of the vehicle in question. Many vehicle makes and models include their own trouble code associated with each given trouble light. Typically, a trouble code indicates some abnormal condition in a given circuit within the vehicle's electronic system. For example, trouble code 42 on a GM vehicle may indicate abnormal voltage readings from the oxygen sensor. Thus, on a vehicle with code 42 set, a professional may connect the breakout box 24 and insert a voltmeter into the terminal associated with the oxygen sensor on that particular vehicle, say terminal T:, and verify the actual voltage in the circuit. It is worthwhile noting that whereas some trouble codes are very specific, others are quite general and in many cases the same code will be set for many different problems; furthermore, many problems will cause the setting of multiple trouble codes.

It is important to note that the diagnostic system associated with the breakout box 24, as described above, is a passive system. That is, the automotive service professional uses the breakout box to access the connector terminals in order to observe the components associated with those terminals typically by connecting a volt meter and from those observations, he is hopefully able to diagnose the problem.

There are a number drawbacks associated with the passive diagnostic approach just described utilizing breakout box 24. One obvious drawback relates to the time it takes to make the diagnosis. An appropriate manual for each given vehicle make and model must be kept and reviewed in order to determine which terminals to access and what to look for, depending upon the particular trouble light that is flashing and the particular vehicle. In many cases, the trouble that is described by the vehicle operator does not always result in a flashing trouble light or the trouble is intermittent and does not always occur at the time the vehicle is being diagnosed. After an extended diagnostic period, the problem may not be found or its results suspect. Moreover, the problem may only occur under certain conditions that cannot be duplicated at the service station. For example, evaluating problems associated with the air management system often require that the vehicle's engine be under load. Of course, this is not possible using breakout box 24 without actually driving the vehicle.

SUMMARY OF THE INVENTION

In view of the foregoing, it is a general object of the present invention to provide a state-of-the-art diagnostic work station designed to provide automotive service professionals with all the tools necessary to perform precision diagnostic testing on today's computer-controlled engines, anti-lock brakes and other such components, as discussed previously in conjunction with FIG. 1.

A more particular object of the present invention is to provide a diagnostic work station which utilizes its own external computer for continuously monitoring, preferably in real time, and analyzing electronic data entering and/or exiting the onboard computer of the vehicle being diagnosed including actual data associated with the vehicle's network of sensors and actuators Another particular object of the present invention is to provide a state-of-the-art diagnostic work station that takes an interactive role, which means that it is not only capable of analyzing the electronic data entering and/or exiting the onboard computer, but it is also capable of controlling the operation of one or more specific actuators independent of the onboard computer and simulating the operation of one or more specific sensors, independent of the actual operation of these sensors, as contrasted with the previously described breakout box 24 which merely takes a passive role.

Still another particular object of the present invention is to provide a state-of-the-art diagnostic work station that is rapidly and easily adapted for use with different vehicle makes and models.

As will be discussed in more detail hereinafter, the particular diagnostic work station, actually system, disclosed herein is specifically designed for high technology automotive vehicles of the type described in conjunction with FIG. 1. Thus, it is designed for use with a vehicle including (1) a network of sensors and actuators for independently sensing and actuating a number of different functions within the vehicle, (2) an onboard computer for monitoring the sensors and controlling operation of the actuators, and (3) cooperating auto-side and computer-side connectors having cooperating auto-side and computer-side plug-in terminals for electrically connecting the onboard computer with the sensors and actuators, again as described previously in conjunction with FIG. 1.

In accordance with one aspect of the present invention, the particular diagnostic work station disclosed herein utilizes means including its own computer arrangement separate from the vehicle's onboard computer, for continuously monitoring and analyzing in real time electronic data entering and/or exiting the onboard computer, that is, the ECM, including actual data associated with the vehicle's network of sensors and actuators. Thus, using the monitor in association with the external computer arrangement, the outputs of a number of related sensors can be simultaneously observed visually while, at the same time, the operation of associated actuators are monitored.

In accordance with another, more complex aspect of the present invention, the diagnostic work station disclosed herein includes a series of components that cooperate with its external computer for allowing the work station to interact directly with the vehicle's network of sensors and actuators and its onboard computer. This is accomplished first by providing suitable means for selectively and temporarily disconnecting one or more specific sensors and/or one or more specific actuators from the vehicle's onboard computer. At the same time, the work station's external computer arrangement is temporarily connected with these latter sensors for simulating the action of each one independent of its actual operation and also connected to these latter actuators for controlling the operation of each of these actuators independent of the onboard computer. At the same time, some of the other sensors and actuators, that is, those not disconnected from the vehicle's onboard computer, can be continuously monitored and analyzed by the external computer. Thus, if it is necessary to observe certain vehicle functions at high altitude or under high or low temperature conditions, using the diagnostic work station disclosed herein, it is not necessary to move the vehicle to a location of high altitude or to subject the vehicle to high or low temperature conditions. Rather, all that is necessary is to disconnect the appropriate barometric and temperature sensors from the vehicle's onboard computer and, using the external computer arrangement, simulate the way the sensors would operate at high altitude and at high or low temperature conditions so that the onboard computer thinks these latter conditions exist. The onboard computer will then operate the rest of the vehicle functions as if that were the case and these latter functions can then be monitored and analyzed by the external computer under these simulated conditions.

Whether the diagnostic work station disclosed herein merely serves a passive role of continuously monitoring and analyzing the vehicle in question or actually interacts with the vehicle, as described briefly above, it is readily and rapidly adaptable for use with vehicles of different makes and models. This is because, although different vehicle makes and models include different sensors and/or actuators and different onboard computers, the work station's external computer is provided with a database for distinguishing between these differences.

BRIEF DESCRIPTION OF THE DRAWINGS

Other, more detailed features of the present invention will become apparent from the following detailed description in conjunction with the drawings, wherein:

FIG. 2 is a diagrammatic illustration, partially in block-diagram, of a diagnostic work station for similar high-technology vehicles, but one which is designed in accordance with the present invention; and FIG. 3 is a diagrammatic illustration of a particular feature of the work station in FIG. 2.

FIGS. 4 and 5 are further diagrammatic illustrations depicting the way the system functions.

DESCRIPTION OF THE PREFERRED EMBODIMENTS

Figure 1:
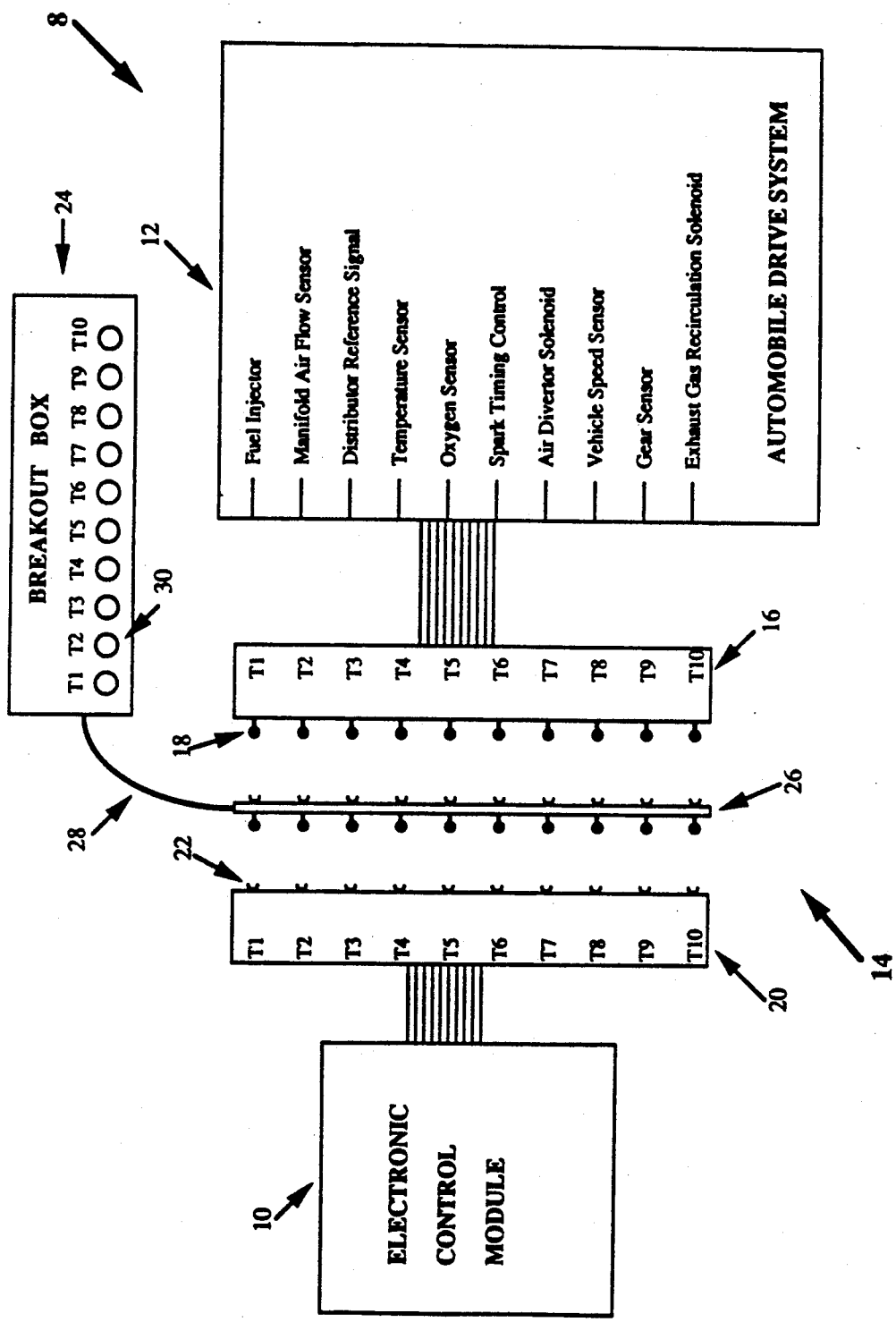
FIG. 1 diagrammatically illustrates, partially in block-diagram, a diagnostic system designed in accordance with the prior art for use with high-technology automotive vehicles.

Turning now to the drawings, attention is immediately directed to FIG. 2, inasmuch as FIG. 1 has been discussed previously. FIG. 2 illustrates a diagnostic work station 32 which is designed in accordance with the present invention to provide automotive service professionals with all the tools necessary to perform precision diagnostic testing on today's high technology vehicles. One such vehicle, generally indicated by the reference numeral 34, is diagrammatically illustrated in FIG. 2 and corresponds to the vehicle described heretofore in conjunction with FIG. 1. Thus, vehicle 34 includes among other components, an entire auto-drive system 35 which itself includes an engine, transmission, brakes, and so on, as well as a network of sensors and actuators associated with these latter components. For purposes of convenience, the sensors and actuators are indicated by the letters S and A with numerical subscripts distinguishing one from the other. Vehicle 34 also includes an onboard computer, specifically the same electronic control module 10 and arrangement 14 for electrically connecting the ECM with the sensors and actuators as described in conjunction with FIG. 1. It may be recalled that arrangement 14 includes an auto-side connector 16 having its own auto-side plug-in terminals 18 and a computer-side connector 20 including its own computer-side plug-in terminals 22. For purposes of convenience, only ten terminals are illustrated, specifically terminals T1-T10. Most of these terminals connect associated sensors or actuators with appropriate circuitry at ECM 10. For example, terminal T1 connects ECM 10 with sensor S1, terminal T2 connects the ECM to sensor S2, and so on. The particular components M7 and G8 illustrated as part of the auto-drive system and connected to the ECM through terminals T7 and T8 will be described hereinafter along with the function of terminal T9.

Having again described the necessary components of vehicle 34 for purposes of the present invention, attention is now directed to diagnostic work station 32. This work station includes its own external computer arrangement 36 which, as will be discussed in more detail below, is specifically designed for three primary purposes. First, it is designed to control the operation of one or more specific actuators independent of one another and independent of the onboard ECM 10. Second, it is designed to simulate the operation of one or more specific sensors, independent of one another and independent of their actual operation. Third, computer arrangement 36 is designed to continuously monitor and analyze in real time all of the electronic data entering and exiting ECM 10 including actual data associated with the network of sensors and actuators.

Still referring to FIG. 2, work station 32 also includes an arrangement 38 which also serves a number of purposes. First, it serves to selectively and temporarily disconnect one or more specific sensors and/or actuators from ECM 10. Second, and at the same time, arrangement 38 serves to connect external computer arrangement 36 to those actuators that have been temporarily disconnected from ECM 10 so that the external computer arrangement can override the ECM and control those actuators. Third, arrangement 38 serves to connect the external computer arrangement 36 into the circuitry of ECM 10 associated with those sensors that have been temporarily disconnected in order to simulate the operation of those sensors. Fourth, arrangement 38 serves to connect external computer arrangement 36 to ECM 10 for monitoring the data entering and/or leaving the ECM, that is, the data passing between the ECM and various vehicle drive system components. Thus, as computer arrangement 36 operates a given actuator, for example, actuator A6, and simulates one or more sensors, for example, sensors S3 and S4, it can also monitor the other actuators and sensors, that is, those actuators and sensors that remain connected to the ECM.

Having described work station 32 generally, attention is now directed to a number of particular examples of the way in which it may be used to diagnose problems associated with the vehicle 34. As one such example, it may be necessary to observe how the advance-retard angle associated with the vehicle's ignition timing changes with temperature. In this case, all of the drive system components in the vehicle remain connected to onboard ECM 10, except for a particular temperature sensor, for example sensor S4. This latter sensor is disconnected from its associated circuitry in ECM 10 and the associated circuitry is connected by arrangement 38 to external computer arrangement 36 through a cooperating computer-side terminal 22 via terminal T4, as will be seen. In this way, computer arrangement 36 can be operated to simulate the temperature sensor connected to T4 by generating the appropriate signal to ECM 10. By modulating this signal in the same way as the actual sensor S4 would, the ECM can be made to believe that the engine itself is varying in temperature causing it to vary the ignition timing accordingly. As a result, the vehicle's advance-retard angle can be observed as a function of temperature without ever leaving the service garage.

As another example, it may be necessary to test the performance of the vehicle's air management system. This system is supposed to allow a certain amount of air to flow from the exhaust back into the intake manifold for controlling the temperature in the manifold by using the heat from the exhaust air. This is controlled by a certain actuator, for example, the exhaust recirculation valve in General Motors cars. However, this valve will only open under certain conditions. One such condition is when the vehicle is under load, as briefly mentioned earlier in the discussion of FIG. 1. Thus, if the vehicle is at the garage, the vehicle's ECM will not itself open the exhaust recirculation valve since the vehicle itself is not under load. At the same time, it is not practical to actually drive the vehicle. Under these circumstances, work station 32 is especially appropriate. In this case, computer arrangement 36 takes over control of certain actuators and simulates certain sensors to make ECM 10 think that the vehicle is under a load. At the same time, it continuously monitors the valve in question in order to see if it actually does open the proper way under this load. Alternatively, it is also possible to use computer arrangement 36 to directly control the EGR value, by disconnecting it from ECM 10, and driving it to open, simultaneously monitoring other vehicle conditions such as temperature and fuel modulation in order to discern whether the value is operating properly.

The foregoing have been two examples of the way in which work station 32 is capable of taking an interactive role in diagnosing vehicle 34. The present invention is certainly not limited to those particular examples. In fact, in certain cases, work station 32 may be used solely for monitoring and analyzing certain vehicle functions without any interactive role at all. An example of this might be the vehicle's cruise control. Since the cruise control is not critical to the vehicle's operation, it may be desirable, from an economic standpoint, to provide the work station without means for interacting with the cruise control. In this case, the cruise control would be connected to computer arrangement 36 in a "monitor only" mode, in which case, the computer arrangement can still analyze operation of the cruise control and not directly affect its operation. In a most economical version of work station 32, it would be designed only to continuously monitor and analyze in real time electronic data entering and exiting the ECM without any interactive roles at all. In this embodiment, the work station serves as a highly sophisticated analytical tool far superior to the breakout box illustrated in FIG. 1, but would have less diagnostic capability than the interactive work station illustrated in FIG. 2.

Having described the way in which work station 32 functions generally and having recited particular examples, attention is now directed to a more detailed discussion of computer arrangement 36 and connector arrangement 38. As illustrated in FIG. 2, this latter arrangement including what may be referred to as a pod 40 which is comprised of a series of lines or channels C1, C2 and so on, include electronic switching circuits to be described below. This pod is disengageably connectable to a vehicle adaptor 42 by means of their respective plug-in cable harnesses 44 and 46. Adaptor 42 is comprised of its own auto-side connector 48 and its own computer-side connector 50, each of which includes its own plug-in terminals complementary to plug-in terminals 18 and 22. In this way the connectors 16 and 48 and the connectors 20 and 50 can be respectively connected together. The reason that the adaptor 42 is disengageably connectable with pod 40 by means of plug-in harnesses 44 and 46 is that the connectors 16 and 20 may differ for different vehicle makes and models and, hence, different adapters must be used. For example, in one vehicle make, the terminal T1 associated with the sensor S1 as shown in FIG. 2, is connected to Channel C1. However, while not shown, for a different vehicle make, the terminal T1 may be associated with different drive system component, for example, sensor S4, and might therefore be connected through the cooperating adaptor to Channel $C^4$ for example. Thus, each adapter has its own unique way of connecting terminals T1, T2 and so on with channel lines C1, C2 and so on.

As stated above, pod 40 is comprised of a series of electronic switching circuits which may be readily provided by those with ordinary skill in the art. However, for purposes of simplicity, these switching circuits are depicted in FIG. 2 as simple mechanical switches and will be referred to herein as either switches or switching circuits. It is important to note that there are three different sets of switching circuits which perform three different functions. There is a first set of switching circuits generally represented by the switches S1, S2, S3 and so on. A second set is indicated at S'1, S'2 and so on, while a third set is shown at S"5, S"6, S"8 and S"10. The function of each set will be described below.

Switches S1, S2, S3 and so on function to selectively connect or disconnect corresponding auto-side terminals 18 to or from associated computer-side terminal 22. Thus, the switch S1 on channel line C1 is shown in its closed condition, thereby connecting the T1 terminal 18 to the T1 terminal 22. This in turn will electrically connect the sensor S1 to its associated circuitry in ECM 10 through the plug-in terminals T1. This is also true for switch S2 on channel line C2 which maintains sensor S2 connected to ECM 10. On the other hand, sensors S3 and S4 are shown in an opened condition, thereby disconnecting the T3 and T4 terminals 18 from the T3 and T4 terminals 22 which, in turn, disconnect sensors S3 and S4 from ECM 10. Note that switches S6 is open, switches S5 and S10 are closed, and there are no switches S associated with channel lines C7, C8 and C9. The C7 channel line, which is a monitor only line as described above, may be connected to, for example, the connector terminals associated with the vehicle's cruise control. In this way, computer arrangement 36 can monitor and analyze the cruise control but it cannot interact with it. The C9 line in FIG. 2 is actually provided to symbolically represent a series of lines for monitoring all of the other lines. This is more realistically depicted in FIG. 3, as will be seen. The C8 line will be discussed hereinafter.

The second series of switches, S'1, S'2 and so on, serve to connect corresponding computer-side terminals 22 to the sensor simulating circuitry 56 within computer arrangement 36 while the third series of switches S"5, S"6 and S"8 serve to connect the corresponding auto-side terminals 18 to the actuator driving circuit 56 within computer arrangement 36. Thus, for example, switch S'1 is shown opened and therefore assures that the circuitry within the ECM 10 and connected to the T1 computer-side terminal 22 is not driven by external computer arrangement 36. On the other hand, switching circuit S'3 connects computer arrangement 36 to the circuitry in ECM 10 associated with sensor S3 through the T3 computer-side terminal 22. At the same time, switching circuit S"6 is closed and therefore connects actuator A6 with computer arrangement 36 through the T6 terminal 18.

With the possible exception of channel line C8, the status of the other switching circuits should be self explanatory from FIG. 2 and the discussion immediately above. Note specifically that the switching circuits S' are associated with sensors and thus connect the computer arrangement 36 to ECM 10 while the switching circuits S" are associated with actuators and hence connect computer arrangement 36 to the actuators. With particular regard to line $C^8$, it should be noted that it includes both an S' and an S" switching circuit. This is because the $C^8$ line serves to test the ground lines in the entire vehicle system. By closing the switch S'8, the ground lines in the ECM 10 can be resistance tested by injecting a known current into the line and measuring the resultant voltage. This is also true for the ground lines of the vehicle drive system side by closing the switch S"8. While only one such line C8 is shown, there are usually a number of such lines.

Still referring to FIG. 2, attention is now directed to a more detailed discussion of computer arrangement 36. As seen there, this arrangement includes its own CPU 52 which can be, for example, part of a readily providable personal computer including an associated monitor 54 and keyboard 55. The arrangement also provides a suitable and readily providable interface between the computer including the necessary digital/analog converters one of which is generally indicated at 56 and analog/digital converters generally indicated at 58. Note that the digital/analog converters 56 allow CPU 52 to drive (actually control the operation of) particular vehicle actuators through switching circuits S" and simulate particular sensors feeding into circuitry within the ECM 10 through cooperating switching circuits S'. On the other hand, the analog/digital converters allow the external CPU 52 to "listen to", that is, monitor data entering and leaving ECM 10. In the case of this listening function, one or more A/D converters can be used for listening to all the terminal lines utilizing a suitable and readily providable sweep mechanism which is operated in a time slicing mode. Also, as will be seen hereinafter in conjunction with FIG. 3, some of the D/A converters associated with actuators are actually driver circuits including on-off switches. Further, note that channels C1–C10 in pod 40 connect to A/D circuitry 58 through a conventional and readily providable multiplexer 59 forming part of the sweep mechanism just mentioned so that individual terminal lines and specific groups of terminal lines can be scanned by the CPU.

As indicated above, CPU 52 may be part of any suitable and readily providable computer, for example a standard personal computer. The software used to run the computer, represented generally by the diagrammatically depicted look up table 59 or menu, is also readily providable by those with ordinary skill in the art in view of the teachings herein. The software must be designed to control the various actuators in the intended manner and simulate the various sensors. It also must have the ability to analyze the various data presented to the external computer. A particular feature of work station 32 resides in a specific software database maintained within CPU 52. As indicated above, different vehicle makes and/or models compatible with work station 32 may include different sensors or actuators, different onboard computers and/or a different arrangement of auto-side and computer-side terminals. As a result, external CPU 52 includes a database for distinguishing between any of these differences in different vehicle makes and models. Thus, the automotive service professional can easily enter the appropriate vehicle identification into CPU 52 using keyboard 55 and provide the appropriate adaptor 32 in order to make the work station compatible with the particular vehicle in question. To this end, the database also includes performance information pertaining to specific sensors and actuators for particular vehicle makes and models. In addition, the CPU and its software include suitable and readily providable means for storing electronic data presented to it into memory, a database having exemplary data associated with the networks of sensors and actuators, and means for comparing the actual data stored in memory with the exemplary data. The CPU and its software also include suitable and readily providable means for carrying out different diagnostic tests by operating certain specific actuators and simulating certain specific sensors in a predetermined way.

Software menu 60 is shown specifically including an "AUTO SELECT" item which represents a data base for distinguishing between vehicle makes and models. The T1–T10 items represent data associated with the sensors, actuators and other components connected with connector terminals T1–T10. As stated above, this data varies with the particular vehicle selected and would include for certain components the desired performance criteria to be used as a reference against actual performance data. The items labeled "Test No. 1", "Test No. 2" and so on refer to a data base for carrying out different predetermined diagnostic tests. The menu 60 illustrated in FIG. 2 is by no means complete, nor is it intended to be complete. It is provided rather as an example of the necessary software required to operate CPU 52 in the desired manner, which software is readily providable, as indicated above. A more detailed discussion of the way in which the overall work station operates from a software standpoint will follow.

Turning now to FIG. 3, attention is directed to a more accurate representation of the switching circuits within pod 40. In this case, the terminal lines associated with terminals T1 and T2 are shown as monitoring lines and, hence, include no switching circuits at all. On the other hand, the terminal lines associated with terminals T3, T4 and T5 do include switching circuits. Note specifically that a single switching circuit is used to combine the function of the previously described switches S and S' or S". Thus, for example, in the case of terminal T3, a single switching circuit S"3 is used to connect the auto-side and ECM side terminals T3 to one another and alternatively to connect the ECM side terminal T3 to D/A circuitry within computer arrangement 36. This is also the case for switching circuit S"4. On the other hand, the terminal line T5 includes a switching circuit Sw5 which in one position connects together the ECM side and auto-side terminals T5 and in the opposite position connects computer arrangement 36, actually its driver circuit 56, to the auto side terminal T5 for connection with the associated actuator A5. As indicated previously, some if not all of the actuators are controlled through driver circuits including on/off switches rather than through D/A converters. In this way, it is insured that any given actuator is always driven by the external computer in a way which is consistent with the actuator's electrical properties, i.e., voltage, current, impedance, etc. For example, a solenoid requires different drive parameters than a stepper monitor. Note also that not only the monitoring lines T1 and T2 in FIG. 3 are shown including A/D converters but all of the other lines, that is, those including switching circuits also include A/D converters which serve to monitor or listen to those lines, regardless of the position of any given switching circuit. In this latter regard, in actual practice, it may be desirable to include a single A/D converter for listening purposes along with a sweep mechanism operated in a time slice mode.

Having now described overall workstation 32, attention is now directed to a specific example of the way in which it operates from a software standpoint. This example is not intended to limit the present invention. The discussion to follow will be organized by means of headings in association with FIGS. 4–5, starting with a discussion of the Data Base Structure, and followed by examples of various predetermined tests which the system is capable of performing.

1. DATA BASE STRUCTURE (see FIG. 4)

The data base (DB) is composed of various tables as shown in FIG. 4, as follows:

Component Table: For every component used with any vehicle, there is an entry in this table. Every entry contains the component identification (ID), type (sensor, thermistor, solenoid, etc.) and electrical parameters (min-max volts, resistance, inductance, translation tables to physical units, etc.).

Channel Table: For every channel Cl, C2 and so on in the pod there is an entry in this table. Every entry contains the channel mux-address, the switch address, the D/A address, and other electrical parameters (i.e. gain, impedence, drive capabilities, etc.).

2. CONNECTOR TABLE

For every ECM used in any vehicle, there is an entry in this table describing the vehicle connector 14 (see FIG. 1). Every entry is itself a table with an entry for every terminal on the particular ECM. Every terminal entry contains the terminal name (e.g., T1, T2), the component connected to this terminal, and the channel C1, C2, and so on, through which this terminal is routed in pod 40.

Engine Table: For every engine used in any vehicle there is an entry in this table containing the vehicle ID number (VIN), general engine information (i.e., number of cylinders, ignition type, injection type, etc.) and the ID of the connector for this engine.

The following specific information should be noted for exemplary purposes.

1. Many engines may share the same connector.
2. Many connectors may have the same terminal configuration.
3. Different components may connect to same terminal on different connectors.
4. Some channels may connect to different components on different connectors.

3. TEST FLOW

Having described the contents of information in the DB, we now proceed with examples of how this information is used in conjunction with actual testing of a vehicle. The first example will be what is called a sweep test, invoked by say item Test No. 1 in menu 60 of FIG. 2. The sweep test is a software function that examines all terminals of a given vehicle sequentially, monitoring them under known conditions for abnormal behavior.

The second example to be discussed, is a functional bypass test, invoked say by item Test No. 5 of menu 60, FIG. 2. A functional test will look at a group of terminals simultaneously, examining a particular correlation in their operation.

4. SWEEP TEST INFORMATION FLOW

Sweep tests are divided into functional groups: key off, key on-engine off, cranking and engine running tests.

Key Off Tests: These tests look at all power ground lines. A software function scans the connector table for the vehicle (FIG. 4) searching for those terminals connected to a component of the type "POWER" or "GROUND", as contained in the component information pointed at through the connector table. For every power terminal, the voltage is read from the appropriate channel and compared to the nominal values of the matching component in the DB.

For every ground terminal, voltage is read and compared as above, then the appropriate switch S" is turned on, routing that channel to one of the D/A's. The particular D/A is then driven by software to inject a known current into the line connected to the terminal on the car side. Voltage drop is read from the appropriate channel and line resistance is computed and compared to the DB values.

Key on-Engine Off: These tests look at all sensors and actuators. For every sensor, voltage is read from the appropriate channel and compared to DB values as above. For all solenoids (actuators) voltage and resistance are measured as for ground lines. In addition, when current is injected into a solenoid, the actual current taken by the solenoid is plotted against time, and inductance is computed from this curve, and compared to DB values.

5. BYPASS TEST INFORMATION FLOW

As an example, consider the oxygen sensor bypass test.

Background: Under constant running conditions (RPM and load) the vehicle ECM will constantly monitor the oxygen sensor output which may be high, indicating high oxygen contents in the exhaust manifold, or low, indicating low oxygen. The ECM responds by modulating the fuel injectors to counter the oxygen readings. Thus, when oxygen is high, the ECM will widen the injector pulse width, causing more fuel to be delivered into the combustion chamber, eventually reducing the oxygen contents in the exhaust manifold, and vice versa when oxygen is low. This scheme is called a negative feedback loop, where injector pulse width is the controlled variable and oxygen is the error signal.

Test Description: While the engine is running, the system 32 will inject a simulated oxygen signal into the ECM. The signal is a square wave, with min-max voltage range based on DB values for a given oxygen sensor. While injecting this signal, the system will simultaneously monitor the Injector driver line, computing in real time the variation in injector pulse width, and also the output of the real oxygen sensor.

Expected Result: The correlation between the injected signal and fuel modulation indicates whether or not the ECM is properly responding to variations in oxygen. The skew between the injected oxygen and the real oxygen indicates the time response of the oxygen sensor. For a vehicle without any faults, the schematic results are shown in FIG. 5.

6. TEST FLOW FOR OXYGEN BYPASS

A software function is provided within the system to execute the above test. First, the connector table for the vehicle (FIG. 4) is scanned, searching for the terminals corresponding to the oxygen signal, the injector drivers (one or more) and the tach signal (RPM). The oxygen channel switch is configured for bypass into the ECM. The appropriate D/A is configured to generate a square wave with min-max voltage equal to nominal values for oxygen from the DB. The injector driver, the oxygen sensor and the tach signal are configured for "Read" (to listen) by properly selecting their respective channels in the A/D mux. The user is instructed to rev the engine to 2000 RPM, and the test begins:

The system monitors the tach signal, waiting for 2000 RPM. At that point, the D/A is enabled which causes the simulated signal to be generated. The program then monitors simultaneously the simulated value, the real oxygen value and the injector driver. The injector signal is converted in real time to a pulse-width value, and is plotted against time together with the other values. This goes on for approximately 15 seconds, at which time bypass is disabled and monitoring stops. The final stage is a mathematical computation done on the data recorded in memory. The correlation of simulated oxygen and injector pulse width is computed, and the skew between simulated oxygen and real oxygen is measured. Both values are compared against good known results.

It is to be understood that the present invention is not limited to the particular computer arrangement 36 or the particular connector arrangement 38 illustrated in FIGS. 2 and 3. Rather, based on the teachings herein, one with ordinary skill in the art can readily modify either of these arrangements so long as they fulfill the functions herein. Moreover, based on the teachings herein, and with suitable and readily providable knowledge about particular automotive vehicles, one with ordinary skill in the software art can readily design the software used to operate computer 52. The present invention does not relate to the software per se but rather to the way in which the overall diagnostic station is able to continuously monitor and analyze vehicle 34 and more particularly to the way it is able to take an interactive role in the diagnostic process. In an actual working embodiment, an IBM PC AT or compatible system has been provided. Tables 1-3 forming the Appendix I attached hereto list examples of actual engines, specific functions and tests by the actual embodiment. The present invention contemplates but is not limited to these particular engines, functions and tests.

APPENDIX I

```
/*******************************************************/
/*     TABLE - 1   ENGINES  CURRENTLY SUPPORTED        */
/*******************************************************/

LEGEND :

MAKE :
  GM      - GENERAL MOTORS (ALL DIVISIONS)
  FORD    - FORD MOTOR CO. (ALL DIVISIONS)
  CHR     - CHRYSLER (ALL DIVISIONS)
  TOYO    - TOYOTA (ALL DIVISIONS)

VIN : THE FEDERALLY MANDATED 17 DIGIT VEHICLE IDENTIFICATION
      NUMBER, FOUND BEHIND THE WINDSHIELD OF EVERY VEHICLE SOLD
      IN THE USA. THE FIRST DIGIT IS COUNTRY CODE, THE SECOND
      IS MANUFACTURER CODE, THE EIGTH DIGIT IS ENGINE ID AND THE
      TENTH DIGIT IS YEAR CODE.

CYLINDERS :
  L4 - 4 CYLINDERS, LINEAR CONFIGURATION
  V6 - 6 CYLINDERS, "V" CONFIGURATION
  V8 - 8 CYLINDERS, "V" CONFIGURATION

DISPLACEMENT : IN LITERS.

FUEL-SYSTEM :
  CARB                  - CARBURATOR
  EFI                   - ELECTRONIC FUEL INJECTION
  TBI                   - THROTTLE BODY INJECTION
  TPI                   - TUNES PORT INJECTION
  CFI                   - CONTINUOUS FUEL INJECTION
  MPI / MPFI            - MULTI PORT INJECTION
  SFI / SEFI / SPFI     - SEQUENTIAL FUEL INJECTION
```

| MAKE | YEAR | ENGINE-ID | CYLINDERS | DISPLACEMENT | FUEL-SYS | COMMENTS |
|---|---|---|---|---|---|---|
| GM | 1981 | 3 | V6 | 3.8L | CARB | TURBO |
| GM | 1981 | 4 | V6 | 4.1L | CARB | |
| GM | 1981 | 5 | L4 | 2.5L | CARB | |
| GM | 1981 | 6 | V8 | 5.7L | CARB | |
| GM | 1981 | 9 | L4 | 1.6L | CARB | |
| GM | 1981 | A | V6 | 3.8L | CARB | |
| GM | 1981 | B | V8 | 5.7L | CARB | |
| GM | 1981 | F | V8 | 4.3L | CARB | |
| GM | 1981 | H | V8 | 5.0L | CARB | |
| GM | 1981 | J | V8 | 4.4L | CARB | |
| GM | 1981 | K | V6 | 3.8L | CARB | |
| GM | 1981 | L | V8 | 5.7L | CARB | |
| GM | 1981 | S | V8 | 4.3L | CARB | |
| GM | 1981 | T | V8 | 4.9L | CARB | TURBO |
| GM | 1981 | W | V8 | 4.9L | CARB | |
| GM | 1981 | X | V6 | 2.8L | CARB | |
| GM | 1981 | Y | V8 | 5.0L | CARB | |
| GM | 1981 | Z | V6 | 2.8L | CARB | |
| GM | 1982 | 0 | L4 | 1.8L | TBI | |
| GM | 1982 | 1 | V6 | 2.8L | CARB | |
| GM | 1982 | 2 | L4 | 2.5L | TBI | |
| GM | 1982 | 3 | V6 | 3.8L | CARB | TURBO |
| GM | 1982 | 4 | V6 | 4.1L | CARB | |

| MAKE | YEAR | ENGINE-ID | CYLINDERS | DISPLACEMENT | FUEL-SYS | COMMENTS |
|---|---|---|---|---|---|---|
| GM | 1982 | 5 | L4 | 2.5L | CARB | |
| GM | 1982 | 7 | V8 | 5.0L | CFI | |
| GM | 1982 | 8 | V8 | 5.7L | CFI | |
| GM | 1982 | 8 | V8 | 4.3L | CARB | |
| GM | 1982 | A | V6 | 3.8L | CARB | |
| GM | 1982 | B | V6 | 2.8L | CARB | TRUCK |
| GM | 1982 | B | L4 | 2.0L | CARB | |
| GM | 1982 | C | L4 | 1.6L | CARB | CAL & FED 5 SPEED |
| GM | 1982 | C | L4 | 1.6L | CARB | FED AUTO 4 SPEED |
| GM | 1982 | E | V6 | 3.0L | CARB | |
| GM | 1982 | F | L4 | 2.5L | CARB | |
| GM | 1982 | G | L4 | 1.8L | CARB | |
| GM | 1982 | H | V8 | 5.0L | CARB | |
| GM | 1982 | J | V8 | 4.4L | CARB | |
| GM | 1982 | K | V6 | 3.8L | CARB | |
| GM | 1982 | L | V8 | 5.7L | CARB | |
| GM | 1982 | R | L4 | 2.5L | TBI | |
| GM | 1982 | X | V6 | 2.8L | CARB | |
| GM | 1982 | Y | V8 | 5.0L | CARB | |
| GM | 1982 | Z | V6 | 2.8L | CARB | |
| GM | 1983 | 0 | L4 | 1.8L | TBI | |
| GM | 1983 | 1 | V6 | 2.8L | CARB | |
| GM | 1983 | 2 | L4 | 2.5L | TBI | |
| GM | 1983 | 4 | V6 | 4.1L | CARB | |
| GM | 1983 | 5 | L4 | 2.5L | CARB | |
| GM | 1983 | 6 | V8 | 5.7L | CARB | |
| GM | 1983 | 8 | V8 | 5.7L | CFI | |
| GM | 1983 | 8 | V6 | 3.8L | CARB | TURBO |
| GM | 1983 | 9 | V6 | 3.8L | CARB | |
| GM | 1983 | 9 | V8 | 5.0L | CARB | |
| GM | 1983 | A | V6 | 3.8L | CARB | |
| GM | 1983 | B | V6 | 2.8L | CARB | TRUCK |
| GM | 1983 | B | L4 | 2.0L | CARB | |
| GM | 1983 | C | L4 | 1.6L | CARB | FEDERAL |
| GM | 1983 | E | V6 | 3.0L | CARB | |
| GM | 1983 | F | L4 | 2.5L | CARB | |
| GM | 1983 | H | V8 | 5.0L | CARB | |
| GM | 1983 | L | V6 | 2.8L | CARB | |
| GM | 1983 | P | L4 | 2.0L | TBI | |
| GM | 1983 | R | L4 | 2.5L | TBI | |
| GM | 1983 | S | V8 | 5.0L | CFI | |
| GM | 1983 | X | V6 | 2.8L | CARB | |
| GM | 1983 | Y | V8 | 5.0L | CARB | |
| GM | 1983 | Z | V6 | 2.8L | CARB | |
| GM | 1984 | 0 | L4 | 1.8L | TBI | |
| GM | 1984 | 1 | V6 | 2.8L | CARB | |
| GM | 1984 | 2 | L4 | 2.5L | TBI | |
| GM | 1984 | 3 | V6 | 3.8L | MPI | |
| GM | 1984 | 4 | V6 | 4.1L | CARB | |
| GM | 1984 | 6 | V8 | 5.7L | CARB | |
| GM | 1984 | 8 | V8 | 5.7L | CFI | |
| GM | 1984 | 9 | V6 | 3.8L | SFI | TURBO |
| GM | 1984 | 9 | V8 | 5.0L | CARB | |
| GM | 1984 | 9 | V6 | 3.8L | CARB | |
| GM | 1984 | A | V6 | 3.8L | CARB | |
| GM | 1984 | B | V6 | 2.8L | CARB | TRUCK |
| GM | 1984 | C | L4 | 1.6L | CARB | FEDERAL |
| GM | 1984 | D | L6 | 4.1L | CARB | TRUCK |
| GM | 1984 | E | V6 | 3.0L | CARB | |
| GM | 1984 | F | V8 | 5.0L | CARB | TRUCK |
| GM | 1984 | G | V8 | 5.0L | CARB | |
| GM | 1984 | H | V8 | 5.0L | CARB | |
| GM | 1984 | J | L4 | 1.8L | MPI | TURBO |
| GM | 1984 | L | V8 | 5.7L | CARB | TRUCK |
| GM | 1984 | L | V6 | 2.8L | CARB | |
| GM | 1984 | P | L4 | 2.0L | TBI | |
| GM | 1984 | R | L4 | 2.5L | TBI | |
| GM | 1984 | X | V6 | 2.8L | CARB | |
| GM | 1984 | Y | V8 | 5.0L | CARB | |
| GM | 1984 | Z | V6 | 2.8L | CARB | |

| MAKE | YEAR | ENGINE-ID | CYLINDERS | DISPLACEMENT | FUEL-SYS | COMMENTS |
|------|------|-----------|-----------|--------------|----------|----------|
| GM | 1985 | 0 | L4 | 1.8L | TBI | |
| GM | 1985 | 2 | L4 | 2.5L | TBI | |
| GM | 1985 | 3 | V6 | 3.8L | MPI | |
| GM | 1985 | 4 | L4 | 1.6L | CARB | |
| GM | 1985 | 6 | V8 | 5.7L | CARB | |
| GM | 1985 | 8 | V8 | 4.1L | DFI | |
| GM | 1985 | 8 | V8 | 5.7L | TPI | |
| GM | 1985 | 9 | V8 | 5.0L | CARB | |
| GM | 1985 | 9 | V6 | 2.8L | MPI | |
| GM | 1985 | 9 | V6 | 3.8L | SFI | TURBO |
| GM | 1985 | A | V6 | 3.8L | CARB | |
| GM | 1985 | B | V6 | 2.8L | CARB | TRUCK |
| GM | 1985 | C | L4 | 1.6L | CARB | |
| GM | 1985 | C | L4 | 1.6L | CARB | |
| GM | 1985 | E | L4 | 2.5L | TBI | TRUCK |
| GM | 1985 | E | V6 | 3.0L | CARB | |
| GM | 1985 | F | V8 | 5.0L | CARB | TRUCK |
| GM | 1985 | F | V8 | 5.0L | TPI | |
| GM | 1985 | G | V8 | 5.0L | CARB | |
| GM | 1985 | H | V8 | 5.0L | CARB | |
| GM | 1985 | J | L4 | 1.8L | MPI | |
| GM | 1985 | K | L4 | 1.5L | CARB | |
| GM | 1985 | L | V8 | 5.7L | CARB | TRUCK |
| GM | 1985 | L | V6 | 3.0L | MPI | |
| GM | 1985 | M | L3 | 1.0L | CARB | |
| GM | 1985 | N | V6 | 4.3L | CARB | TRUCK |
| GM | 1985 | P | L4 | 2.0L | TBI | |
| GM | 1985 | R | L4 | 2.5L | TBI | |
| GM | 1985 | S | V6 | 2.8L | MPI | |
| GM | 1985 | U | L4 | 2.5L | TBI | |
| GM | 1985 | W | V6 | 2.8L | MPI | |
| GM | 1985 | X | V6 | 2.8L | CARB | |
| GM | 1985 | Y | V8 | 5.0L | CARB | |
| GM | 1985 | Z | V6 | 4.3L | TBI | |
| GM | 1986 | 0 | L4 | 1.8L | TBI | |
| GM | 1986 | 2 | L4 | 2.5L | TBI | |
| GM | 1986 | 3 | V6 | 3.8L | SFI | |
| GM | 1986 | 6 | V8 | 5.7L | CARB | |
| GM | 1986 | 7 | V6 | 3.8L | SFI | TURBO |
| GM | 1986 | 8 | V8 | 5.7L | TPI | |
| GM | 1986 | 9 | V8 | 5.0L | CARB | |
| GM | 1986 | 9 | V6 | 2.8L | MPI | |
| GM | 1986 | A | V6 | 3.8L | CARB | |
| GM | 1986 | B | V6 | 3.8L | SFI | |
| GM | 1986 | C | L4 | 1.6L | CARB | FEDERAL |
| GM | 1986 | E | L4 | 2.5L | TBI | TRUCK |
| GM | 1986 | F | V8 | 5.0L | CARB | TRUCK |
| GM | 1986 | F | V8 | 5.0L | TPI | |
| GM | 1986 | G | V8 | 5.0L | CARB | |
| GM | 1986 | H | V8 | 5.0L | CARB | |
| GM | 1986 | J | L4 | 1.8L | MPI | TURBO |
| GM | 1986 | L | V8 | 5.7L | CARB | TRUCK |
| GM | 1986 | L | V6 | 3.0L | MPI | |
| GM | 1986 | N | V6 | 4.3L | CARB | TRUCK |
| GM | 1986 | P | L4 | 2.0L | TBI | |
| GM | 1986 | R | V6 | 2.8L | TBI | TRUCK |
| GM | 1986 | R | L4 | 2.5L | TBI | |
| GM | 1986 | S | V6 | 2.8L | MPI | |
| GM | 1986 | U | L4 | 2.5L | TBI | |
| GM | 1986 | W | V6 | 2.8L | MPI | |
| GM | 1986 | Y | V8 | 5.0L | CARB | |
| GM | 1986 | Z | V6 | 4.3L | TBI | TRUCK |
| GM | 1986 | Z | V6 | 4.3L | TBI | |
| GM | 1987 | 1 | L4 | 2.0L | TBI | |
| GM | 1987 | 3 | V6 | 3.8L | SFI | |
| GM | 1987 | 6 | V8 | 5.7L | CARB | |
| GM | 1987 | 7 | V6 | 3.8L | SFI | TURBO |
| GM | 1987 | 8 | V8 | 5.0L | TPI | |
| GM | 1987 | 8 | V8 | 5.7L | TPI | |
| GM | 1987 | 9 | V6 | 2.8L | MPI | |

| MAKE | YEAR | ENGINE-ID | CYLINDERS | DISPLACEMENT | FUEL-SYS | COMMENTS |
|------|------|-----------|-----------|--------------|----------|----------|
| GM | 1987 | 9 | V8 | 5.0L | CARB | |
| GM | 1987 | A | V6 | 3.8L | CARB | |
| GM | 1987 | C | L4 | 1.6L | CARB | |
| GM | 1987 | E | L4 | 2.5L | TBI | TRUCK |
| GM | 1987 | F | V8 | 5.0L | TPI | |
| GM | 1987 | G | V8 | 5.0L | CARB | |
| GM | 1987 | H | V8 | 5.0L | TBI | TRUCK |
| GM | 1987 | H | V8 | 5.0L | CARB | |
| GM | 1987 | K | V8 | 5.7L | TBI | TRUCK |
| GM | 1987 | K | L4 | 2.0L | TBI | |
| GM | 1987 | M | L4 | 2.0L | MPI | TURBO |
| GM | 1987 | N | V8 | 7.4L | TBI | TRUCK |
| GM | 1987 | R | V6 | 2.8L | TBI | TRUCK |
| GM | 1987 | R | L4 | 2.5L | TBI | |
| GM | 1987 | S | V6 | 2.8L | MPI | |
| GM | 1987 | U | L4 | 2.5L | TBI | |
| GM | 1987 | W | V6 | 2.8L | MPI | |
| GM | 1987 | Y | V8 | 5.0L | CARB | |
| GM | 1987 | Z | V6 | 4.3L | TBI | TRUCK |
| GM | 1987 | Z | V6 | 4.3L | TBI | |
| GM | 1988 | 1 | L4 | 2.0L | TBI | |
| GM | 1988 | 3 | V6 | 3.8L | SFI | |
| GM | 1988 | 6 | V8 | 5.7L | CARB | |
| GM | 1988 | 7 | V6 | 3.8L | SFI | TURBO BUICK REGAL |
| GM | 1988 | 8 | V8 | 5.7L | TPI | |
| GM | 1988 | 9 | V6 | 2.8L | MPI | |
| GM | 1988 | C | V6 | 3.8L | SFI | |
| GM | 1988 | D | L4 | 2.3L | MPI | |
| GM | 1988 | E | L4 | 2.5L | TBI | TRUCK |
| GM | 1988 | E | V8 | 5.0L | TBI | |
| GM | 1988 | F | V8 | 5.0L | TPI | |
| GM | 1988 | G | V8 | 5.0L | CARB | |
| GM | 1988 | H | V8 | 5.0L | TBI | TRUCK |
| GM | 1988 | H | V8 | 5.0L | CARB | |
| GM | 1988 | K | V8 | 5.7L | TBI | TRUCK |
| GM | 1988 | K | L4 | 2.0L | TBI | |
| GM | 1988 | L | V6 | 3.0L | MPI | |
| GM | 1988 | M | L4 | 2.0L | MPI | TURBO |
| GM | 1988 | N | V8 | 7.4L | TBI | TRUCK |
| GM | 1988 | R | V6 | 2.8L | TBI | TRUCK |
| GM | 1988 | R | L4 | 2.5L | TBI | |
| GM | 1988 | S | V6 | 2.8L | MPI | |
| GM | 1988 | U | L4 | 2.5L | TBI | |
| GM | 1988 | W | V6 | 2.8L | MPI | 4TH DIGIT W |
| GM | 1988 | W | V6 | 2.8L | MPI | ALL OTHERS |
| GM | 1988 | Y | V8 | 5.0L | CARB | |
| GM | 1988 | Z | V6 | 4.3L | TBI | TRUCK |
| GM | 1988 | Z | V6 | 4.3L | TBI | |
| GM | 1989 | 1 | L4 | 2.0L | TBI | |
| GM | 1989 | 7 | V6 | 3.8L | SFI | TURBO |
| GM | 1989 | 7 | V8 | 5.7L | TBI | |
| GM | 1989 | 8 | V8 | 5.7L | TPI | |
| GM | 1989 | A | L4 | 2.3L | MPI | |
| GM | 1989 | C | V6 | 3.8L | SFI | |
| GM | 1989 | D | L4 | 2.3L | MPI | |
| GM | 1989 | E | L4 | 2.5L | TBI | TRUCK |
| GM | 1989 | E | V8 | 5.0L | TBI | |
| GM | 1989 | F | V8 | 5.0L | TPI | |
| GM | 1989 | H | V8 | 5.0L | TBI | TRUCK |
| GM | 1989 | K | V8 | 5.7L | TBI | TRUCK |
| GM | 1989 | K | L4 | 2.0L | TBI | |
| GM | 1989 | M | L4 | 2.0L | MPI | TURBO |
| GM | 1989 | N | V8 | 7.4L | TBI | TRUCK |
| GM | 1989 | N | V6 | 3.3L | MPI | |
| GM | 1989 | R | V6 | 2.8L | TBI | TRUCK |
| GM | 1989 | R | L4 | 2.5L | TBI | |
| GM | 1989 | S | V6 | 2.8L | MPI | |
| GM | 1989 | T | V6 | 3.1L | MPI | 4TH DIGIT W |
| GM | 1989 | T | V6 | 3.1L | MPI | PONTIAC 6000 |
| GM | 1989 | U | L4 | 2.5L | TBI | |

| MAKE | YEAR | ENGINE-ID | CYLINDERS | DISPLACEMENT | FUEL-SYS | COMMENTS |
|---|---|---|---|---|---|---|
| GM | 1989 | W | V6 | 2.8L | MPI | 4TH DIGIT W |
| GM | 1989 | W | V6 | 2.8L | MPI | ALL OTHERS |
| GM | 1989 | Y | V8 | 5.0L | CARB | |
| GM | 1989 | Z | V6 | 4.3L | TBI | TRUCK |
| GM | 1989 | Z | V6 | 4.3L | TBI | |
| FORD | 1981 | A | L4 | 2.3L | CARB | MCU |
| FORD | 1981 | D | V8 | 4.2L | CARB | MCU |
| FORD | 1981 | E | V6 | 4.9L | CARB | MCU |
| FORD | 1981 | F | V8 | 5.0L | CFI | EEC III |
| FORD | 1981 | F | V8 | 5.0L | CARB | MCU |
| FORD | 1981 | G | V8 | 5.8L | CARB | EEC III |
| FORD | 1981 | G | V8 | 5.8L | CARB | MCU |
| FORD | 1981 | W | V8 | 5.8L | CARB | MCU |
| FORD | 1982 | 3 | V6 | 3.8L | CARB | MCU |
| FORD | 1982 | A | L4 | 2.3L | CARB | MCU |
| FORD | 1982 | D | V8 | 4.2L | CARB | MCU |
| FORD | 1982 | E | V6 | 4.9L | CARB | MCU |
| FORD | 1982 | F | V8 | 5.0L | CARB | MCU |
| FORD | 1982 | F | V8 | 5.0L | CFI | EEC III |
| FORD | 1982 | G | V8 | 5.8L | CARB | MCU |
| FORD | 1982 | G | V8 | 5.8L | CARB | EEC III |
| FORD | 1982 | W | V8 | 5.8L | CARB | EEC III |
| FORD | 1983 | 3 | V6 | 3.8L | CARB | MCU |
| FORD | 1983 | 5 | L4 | 1.6L | EFI | EEC IV |
| FORD | 1983 | A | L4 | 2.3L | CARB | MCU |
| FORD | 1983 | F | V8 | 5.0L | CFI | EEC III |
| FORD | 1983 | G | V8 | 5.8L | CARB | MCU |
| FORD | 1983 | G | V8 | 5.8L | CARB | EEC III |
| FORD | 1983 | W | L4 | 2.3L | EFI | TURBO EEC IV |
| FORD | 1983 | Y | V6 | 4.9L | CARB | MCU |
| FORD | 1984 | 3 | V6 | 3.8L | CFI | EEC IV |
| FORD | 1984 | 5 | L4 | 1.6L | EFI | EEC IV |
| FORD | 1984 | A | L4 | 2.3L | CARB | EEC IV |
| FORD | 1984 | F | V8 | 5.0L | CFI | EEC III |
| FORD | 1984 | J | L4 | 2.3L | CARB | EEC IV |
| FORD | 1984 | M | V8 | 5.0L | CFI | EEC IV |
| FORD | 1984 | R | L4 | 2.3L | CARB | EEC IV |
| FORD | 1984 | S | L4 | 2.3L | EFI | |
| FORD | 1984 | T | L4 | 2.3L | EFI | TURBO EEC IV |
| FORD | 1984 | W | L4 | 2.3L | EFI | TURBO EEC IV |
| FORD | 1984 | Y | V6 | 4.9L | CARB | EEC IV |
| FORD | 1985 | 3 | V6 | 3.8L | CFI | |
| FORD | 1985 | 5 | L4 | 1.6L | EFI | |
| FORD | 1985 | 8 | L4 | 1.6L | EFI | TURBO |
| FORD | 1985 | A | L4 | 2.3L | CARB | TRUCK |
| FORD | 1985 | A | L4 | 2.3L | CARB | |
| FORD | 1985 | F | V8 | 5.0L | CFI | |
| FORD | 1985 | G | V8 | 5.8L | CARB | MCU |
| FORD | 1985 | N | V8 | 5.0L | EFI | |
| FORD | 1985 | S | V6 | 2.8L | CARB | |
| FORD | 1985 | S | L4 | 2.3L | EFI | |
| FORD | 1985 | T | L4 | 2.3L | EFI | TURBO |
| FORD | 1985 | W | L4 | 2.3L | EFI | TURBO |
| FORD | 1985 | X | L4 | 2.3L | CFI | |
| FORD | 1985 | Y | V6 | 4.9L | CARB | |
| FORD | 1986 | 3 | V6 | 3.8L | CFI | |
| FORD | 1986 | A | L4 | 2.3L | EFI | |
| FORD | 1986 | A | L4 | 2.3L | CARB | |
| FORD | 1986 | D | L4 | 2.5L | CFI | |
| FORD | 1986 | F | V8 | 5.0L | SEFI | |
| FORD | 1986 | G | V8 | 5.8L | CARB | MCU |
| FORD | 1986 | J | L4 | 1.9L | EFI | |
| FORD | 1986 | N | V8 | 5.0L | EFI | |
| FORD | 1986 | S | L4 | 2.8L | CARB | |

| MAKE | YEAR | ENGINE-ID | CYLINDERS | DISPLACEMENT | FUEL-SYS | COMMENTS |
|------|------|-----------|-----------|--------------|----------|----------|
| FORD | 1986 | T | V6 | 2.9L | EFI | |
| FORD | 1986 | T | L4 | 2.3L | EFI | TURBO |
| FORD | 1986 | U | V6 | 3.0L | EFI | TRUCK |
| FORD | 1986 | U | V6 | 3.0L | EFI | |
| FORD | 1986 | W | L4 | 2.3L | EFI | TURBO |
| FORD | 1986 | X | L4 | 2.3L | CFI | |
| FORD | 1986 | Y | V6 | 4.9L | CARB | |
| FORD | 1987 | 4 | V6 | 3.8L | CFI | |
| FORD | 1987 | 9 | L4 | 1.9L | CFI | |
| FORD | 1987 | A | L4 | 2.3L | EFI | |
| FORD | 1987 | D | L4 | 2.5L | CFI | |
| FORD | 1987 | F | V8 | 5.0L | CFI | |
| FORD | 1987 | G | V8 | 5.8L | CARB | MCU |
| FORD | 1987 | J | L4 | 1.9L | EFI | |
| FORD | 1987 | M | V8 | 5.0L | SEFI | |
| FORD | 1987 | N | V8 | 5.0L | EFI | |
| FORD | 1987 | T | V6 | 2.9L | EFI | |
| FORD | 1987 | U | V6 | 3.0L | EFI | TRUCK |
| FORD | 1987 | U | V6 | 3.0L | EFI | |
| FORD | 1987 | W | L4 | 2.3L | EFI | TURBO |
| FORD | 1987 | X | L4 | 2.3L | CFI | |
| FORD | 1987 | Y | V6 | 4.9L | EFI | |
| FORD | 1988 | 4 | V6 | 3.8L | EFI | LINCOLN |
| FORD | 1988 | 4 | V6 | 3.8L | EFI | |
| FORD | 1988 | 9 | L4 | 1.9L | CFI | |
| FORD | 1988 | A | L4 | 2.3L | EFI | |
| FORD | 1988 | D | L4 | 2.5L | CFI | |
| FORD | 1988 | E | V8 | 5.0L | SEFI | |
| FORD | 1988 | F | V8 | 5.0L | SEFI | |
| FORD | 1988 | G | V8 | 7.5L | EFI | |
| FORD | 1988 | G | V8 | 5.8L | CARB | MCU |
| FORD | 1988 | H | V8 | 5.8L | EFI | |
| FORD | 1988 | J | L4 | 1.9L | EFI | |
| FORD | 1988 | N | V8 | 5.0L | EFI | |
| FORD | 1988 | T | V6 | 2.9L | EFI | |
| FORD | 1988 | U | V6 | 3.0L | EFI | AEROSTAR |
| FORD | 1988 | U | V6 | 3.0L | EFI | |
| FORD | 1988 | W | L4 | 2.3L | EFI | TURBO |
| FORD | 1988 | X | L4 | 2.3L | CFI | |
| FORD | 1988 | Y | V6 | 4.9L | EFI | |
| FORD | 1989 | 4 | V6 | 3.8L | SEFI | CONTINENTAL |
| FORD | 1989 | 4 | V6 | 3.8L | SEFI | RWD |
| FORD | 1989 | 4 | V6 | 3.8L | SEFI | FWD |
| FORD | 1989 | 9 | L4 | 1.9L | CFI | |
| FORD | 1989 | A | L4 | 2.3L | EFI | |
| FORD | 1989 | A | L4 | 2.3L | EFI | OHC |
| FORD | 1989 | C | V6 | 3.8L | SEFI | SUPERCHARGE |
| FORD | 1989 | D | L4 | 2.5L | CFI | |
| FORD | 1989 | E | V8 | 5.0L | SEFI | |
| FORD | 1989 | F | V8 | 5.0L | EFI | |
| FORD | 1989 | G | V8 | 5.8L | CARB | |
| FORD | 1989 | G | V8 | 7.5L | EFI | |
| FORD | 1989 | H | V8 | 5.8L | EFI | |
| FORD | 1989 | J | L4 | 1.9L | EFI | |
| FORD | 1989 | N | V8 | 5.0L | EFI | |
| FORD | 1989 | T | V6 | 2.9L | EFI | |
| FORD | 1989 | T | L4 | 2.3L | EFI | TURBO |
| FORD | 1989 | U | V6 | 3.0L | EFI | AEROSTAR |
| FORD | 1989 | U | V6 | 3.0L | EFI | |
| FORD | 1989 | X | L4 | 2.3L | EFI | |
| FORD | 1989 | Y | V6 | 4.9L | EFI | |
| FORD | 1989 | Y | V6 | 3.0L | SEFI | |
| CHR | 1984 | D | L4 | 2.2L | TBI | |
| CHR | 1984 | E | L4 | 2.2L | EFI | TURBO |
| CHR | 1985 | D | L4 | 2.2L | TBI | |
| CHR | 1985 | E | L4 | 2.2L | EFI | TURBO |

| MAKE | YEAR | ENGINE-ID | CYLINDERS | DISPLACEMENT | FUEL-SYS | COMMENTS |
|---|---|---|---|---|---|---|
| CHR | 1985 | K | L4 | 2.5L | TBI | |
| CHR | 1986 | D | L4 | 2.2L | TBI | |
| CHR | 1986 | E | L4 | 2.2L | EFI | TURBO |
| CHR | 1986 | K | L4 | 2.5L | TBI | |
| CHR | 1987 | 3 | V6 | 3.0L | MPFI | |
| CHR | 1987 | D | L4 | 2.2L | TBI | |
| CHR | 1987 | E | L4 | 2.2L | MPFI | TURBO I |
| CHR | 1987 | K | L4 | 2.5L | TBI | W/ SMEC CONNECTOR |
| CHR | 1987 | K | L4 | 2.5L | TBI | |
| CHR | 1987 | L | L4 | 2.2L | MPFI | TURBO II SHELBY |
| CHR | 1988 | 3 | V6 | 3.0L | MPFI | |
| CHR | 1988 | D | L4 | 2.2L | TBI | |
| CHR | 1988 | E | L4 | 2.2L | MPFI | TURBO TURBO I |
| CHR | 1988 | K | L4 | 2.5L | TBI | |
| CHR | 1988 | L | L4 | 2.2L | MPFI | TURBO II SHELBY |
| CHR | 1988 | M | V6 | 3.9L | TBI | |
| CHR | 1988 | T | V8 | 5.2L | TBI | |
| CHR | 1989 | 3 | V6 | 3.0L | MPFI | PASSENGER CARS |
| CHR | 1989 | 3 | V6 | 3.0L | MPFI | TRUCKS AND VANS |
| CHR | 1989 | 5 | V8 | 5.9L | TBI | |
| CHR | 1989 | A | L4 | 2.2L | MPFI | TURBO TURBO II |
| CHR | 1989 | D | L4 | 2.2L | SPFI | |
| CHR | 1989 | G | L4 | 2.5L | TBI | |
| CHR | 1989 | J | L4 | 2.5L | MPFI | TURBO TURBO II |
| CHR | 1989 | K | L4 | 2.5L | SPFI | |
| CHR | 1989 | X | V6 | 3.9L | TBI | |
| CHR | 1989 | Y | V8 | 5.2L | TBI | |
| CHR | 1989 | Z | V8 | 5.9L | TBI | |
| TOYO | 1983 | M | V6 | 2.8L | | |
| TOYO | 1983 | R | L4 | 2.4L | | |
| TOYO | 1983 | S | L4 | 2.0L | | |
| TOYO | 1984 | M | V6 | 2.8L | | |
| TOYO | 1984 | R | L4 | 2.4L | | |
| TOYO | 1984 | S | L4 | 2.0L | | |
| TOYO | 1985 | A | L4 | 1.6L | | RWD COROLLA ONLY |
| TOYO | 1985 | A | L4 | 1.6L | | EXCEPT RWD COROLLA |
| TOYO | 1985 | M | V6 | 2.8L | | |
| TOYO | 1985 | R | L4 | 2.4L | | |
| TOYO | 1985 | S | L4 | 2.0L | | |
| TOYO | 1986 | A | L4 | 1.6L | | RWD COROLLA ONLY |
| TOYO | 1986 | A | L4 | 1.6L | | EXCEPT RWD COROLLA |
| TOYO | 1986 | M | V6 | 3.0L | | |
| TOYO | 1986 | M | V6 | 2.8L | | |
| TOYO | 1986 | S | L4 | 2.0L | | |
| TOYO | 1986 | S | L4 | 2.0L | | |
| TOYO | 1987 | A | L4 | 1.6L | | RWD COROLLA ONLY |
| TOYO | 1987 | A | L4 | 1.6L | | EXCEPT RWD COROLLA |
| TOYO | 1987 | M | V6 | 2.8L | | |
| TOYO | 1987 | S | L4 | 2.0L | | |
| TOYO | 1987 | S | L4 | 2.0L | | |
| TOYO | 1988 | A | L4 | 1.6L | | |
| TOYO | 1988 | M | V6 | 2.8L | | |
| TOYO | 1988 | S | L4 | 2.0L | | 3S-GTE |
| TOYO | 1988 | S | L4 | 2.0L | | |
| TOYO | 1988 | S | L4 | 2.0L | | |
| TOYO | 1988 | V | V6 | 2.5L | | |
| TOYO | 1989 | A | L4 | 1.6L | | |
| TOYO | 1989 | S | L4 | 2.0L | | 3S-GTE |
| TOYO | 1989 | S | L4 | 2.0L | | |

```
MAKE   YEAR   ENGINE-ID   CYLINDERS   DISPLACEMENT   FUEL-SYS   COMMENTS

TOYO   1989      S           L4          2.0L
TOYO   1989      V           V6          2.5L

/*********************************************************************/
/*    TABLE - 2 : LIST OF ALL SENSORS, ACTUATORS AND SIGNALS         */
/*                CURRENTLY IN THE DATABASE FOR GM AND FORD.         */
/*    NOTE : A PARTICULAR VEHICLE WILL ONLY USE A SUBSET OF THE      */
/*           COMPONENTS IN THIS LIST, TYPICALLY 20-40.               */
/*********************************************************************/

LEGEND :

MAKE : MANUFACTURER ID.
  GM   - GENERAL MOTORS (ALL DIVISIONS).
  FORD - FORD MOTOR CO. (ALL DIVISIONS).

NAME : A SHORTHAND NAME USED BY THE MANUFACTURER TO DESIGNATE THE
       PARTICULAR SIGNAL.

TYPE : THE COMPONENT TYPE CONNECTED TO THIS SIGNAL.
  RELAY       - MECHANICAL ON/OFF RELAY.
  SWITCH      - ELECTRICAL ON/OFF SWITCH.
  SOLENOID    - ELECTRICAL SOLENOID.
  STP_MOTOR   - STEPPER MOTOR.
  WARN_LT     - WARNING LIGHT.
  THERMISTOR  - HEAT VARIABLE RESISTOR.
  RESISTOR    - VARIABLE RESISTOR (POTENTIOMETER).
  TRANSDUCER  - SOLID STATE SENSOR.
  PIEZO       - PIEZO ELECTRIC TRANSDUCER.
  FREQ_GEN    - FREQUENCY GENERATOR.
  HALL_SWITCH - HALL EFFECT SWITCH.
  POWER       - POWER LINE.
  GROUND      - GROUND LINE.

DIRECTION :
  INPUT  - TO ECM, GENERALLY A SENSOR.
  OUTPUT - FROM ECM, GENERALLY AN ACTUATOR.

MAKE   NAME       TYPE          DIRECTION    DESCRIPTION

GM     AC ON      SWITCH        INPUT        AIR CONDITIONING STATUS
GM     AC CLTCH   RELAY         OUTPUT       AIR CONDITIONING CLUTCH CONTROL
GM     AC RELAY   RELAY         OUTPUT       AIR CONDITIONING CONSTANT RELAY
GM     AC CUT/O   RELAY         OUTPUT       AIR CONDITIONING CUTOUT CONTROL
GM     AC P/SW    SWITCH        INPUT        AIR CONDITIONING PRESSURE SWITCH
GM     AD SOL     SOLENOID      OUTPUT       AIR DIVERTER SOLENOID
GM     AC SOL     SOLENOID      OUTPUT       AIR CONTROL SOLENOID
GM     AIR/SOL    SOLENOID      OUTPUT       AIR SWITCHING SOLENOID
GM     ALT C/SW   SWITCH        INPUT        ALTITUDE COMP SWITCH
GM     ATS        THERMISTOR    INPUT        AIR TEMPERATURE SENSOR SIGNAL
GM     BARO       PIEZO         INPUT        BAROMETRIC PRESSURE SENSOR
GM     BRK SW     SWITCH        INPUT        BRAKE SWITCH
GM     BYPASS     SWITCH        OUTPUT       IGNITION MODULE BYPASS
GM     CAN PURG   SOLENOID      OUTPUT       CANISTER PURGE SOLENOID
GM     CHK ENG    WARN_LT       OUTPUT       CHECK ENGINE LIGHT
GM     CAM REF    FREQ_GEN      INPUT        CAM REFERENCE SIGNAL
GM     CS MOD     SWITCH        OUTPUT       COLD START MODIFIER
GM     C/F CTL    RELAY         OUTPUT       COOLANT FAN CONTROL
GM     CF REQ     SWITCH        OUTPUT       COOLENT FAN REQUEST
GM     COOL LT    WARN_LT       OUTPUT       COOLANT TEMPERATURE LIGHT
GM     CON BATT   POWER         INPUT        CONTINUOUS BATTERY
GM     CRNK SIG   HALL_SWITCH   INPUT        CRANK SIGNAL
GM     CRNK REF   FREQ_GEN      INPUT        CRANK REFERENCE PULSE IN
GM     CRNK GND   GROUND        INPUT        CRANK REFERENCE GROUND
GM     C\SW       SWITCH        INPUT        CRUISE CONTROL SWITCH GENERAL
GM     C\ENAB     RELAY         INPUT        CRUISE ENGAGE
GM     C\RES      SWITCH        INPUT        CRUISE RESUME
GM     C\SET      SWITCH        INPUT        CRUISE SET
GM     CTS        THERMISTOR    INPUT        COOLANT TEMPERATURE SENSOR
```

| MAKE | NAME | TYPE | DIRECTION | DESCRIPTION |
|---|---|---|---|---|
| GM | CLS | THERMISTOR | INPUT | COOLANT LEVEL SENSOR |
| GM | CYL SEL | SWITCH | INPUT | CYLINDER SELECT W/GROUND |
| GM | 4CYL M | SWITCH | INPUT | 4 CYLINDER SELECT W/GROUND |
| GM | 6CYL M | SWITCH | INPUT | 6 CYLINDER SELECT W/GROUND |
| GM | 8CYL M | SWITCH | INPUT | 8 CYLINDER SELECT W/GROUND |
| GM | DIAG EN | SWITCH | INPUT | DIAGNOSTIC TEST TERMINAL |
| GM | DREF | FREQ_GEN | INPUT | DISTRIBUTOR REFERENCE PULSE |
| GM | DREF 2X | FREQ_GEN | INPUT | DISTRIBUTOR REFERENCE 2X SIGNAL |
| GM | DREF 18X | FREQ_GEN | INPUT | DISTRIBUTOR REFERENCE 18X SIGNAL |
| GM | P/N DRV | SWITCH | OUTPUT | PARK NEUTRAL DRIVE INDICATOR |
| GM | EAC SOL | SOLENOID | OUTPUT | AIR DIVERTER SOLENOID |
| GM | E CELL | SWITCH | OUTPUT | VEHICLE ELASPED CELL TIMER |
| GM | ECC CLU | RELAY | OUTPUT | ELECTRONIC CLIMATE CONTROL CLUTCH |
| GM | EFE | RELAY | OUTPUT | EARLY FUEL EVAPERATION |
| GM | EGR POS | RESISTOR | INPUT | EXHAUST GAS RECIRCULATION POSTION |
| GM | EGR SW | SWITCH | INPUT | EGR DIAGNOSTIC SWITCH |
| GM | EGR V\SW | SWITCH | OUTPUT | EGR VAC CONTROL SWITCH |
| GM | EGR PWM | SOLENOID | OUTPUT | EGR PULSE WIDTH MOD |
| GM | EGRC | SOLENOID | OUTPUT | EGR CONTROL SOLENOID |
| GM | EGR WOT | SWITCH | INPUT | EGR WIDE OPEN THROTTLE |
| GM | EGR CUT | SWITCH | INPUT | EXHAUST GAS RECIRCULATION RELAY |
| GM | EN AIR | SOLENOID | OUTPUT | AIR CONTROL SOLENOID |
| GM | ESC | FREQ_GEN | INPUT | ELECTRONIC SPARK RETARD CONTROL |
| GM | EST | FREQ_GEN | OUTPUT | ELECTRONIC SPARK TIMING CONTROL |
| GM | FP RLY | RELAY | OUTPUT | FUEL PUMP RELAY |
| GM | M/C SOL | SOLENOID | OUTPUT | MIXTURE CONTROL SOLENOID |
| GM | FUEL SIG | POWER | INPUT | FUEL SIGNAL |
| GM | TRNS SW | SWITCH | INPUT | GEAR SWITCH |
| GM | CTS GND | GROUND | INPUT | GROUND COOLANT TEMPERATURE SIGNAL |
| GM | MAF GND | GROUND | OUTPUT | MASS AIR FLOW GROUND |
| GM | MAP GND | GROUND | OUTPUT | MAP SENSOR GROUND |
| GM | MAT GND | GROUND | OUTPUT | MANIFOLD AIR TEMPERATURE GROUND |
| GM | HI G\SW | SWITCH | OUTPUT | HIGH GEAR SWITCH INPUT |
| GM | HD/LV | SOLENOID | OUTPUT | HOOD LOUVER SOLENOID |
| GM | HOT LT | WARN_LT | OUTPUT | HOT LIGHT |
| GM | IAC | STP_MOTOR | OUTPUT | IDLE AIR CONTROL |
| GM | IGN GND | GROUND | INPUT | IGNITION GROUND |
| GM | ILC | SOLENOID | OUTPUT | IDLE LOAD COMPENSATOR |
| GM | INJ | SOLENOID | OUTPUT | INJECTOR DRIVER |
| GM | INJ GND | GROUND | INPUT | INJECTOR GROUND |
| GM | INJ SEL | SWITCH | OUTPUT | INJECTOR SELECT |
| GM | ISC | STP_MOTOR | OUTPUT | IDLE SPEED CONTROL |
| GM | ISC N/SW | SWITCH | INPUT | IDLE SPEED NOSE SWITCH |
| GM | KEY PWR | POWER | INPUT | KEY ON POWER |
| GM | KNK SEN | PIEZO | INPUT | KNOCK SENSOR |
| GM | IAC | STP_MOTOR | OUTPUT | IDLE AIR CONTROL |
| GM | MAF | RESISTOR | INPUT | MASS AIR FLOW SENSOR |
| GM | MAF | FREQ_GEN | INPUT | MASS AIR FLOW SENSOR |
| GM | MA B/OFF | RELAY | OUTPUT | MASS AIR FLOW BURN OFF |
| GM | MAP | PIEZO | INPUT | MANIFOLD ABSOLUT PRESSURE |
| GM | MAT | THERMISTOR | INPUT | MANIFOLD AIR TEMPERATURE |
| GM | OS ATS | THERMISTOR | INPUT | OUTSIDE AIR TEMPERATURE |
| GM | OD RQ/AT | SWITCH | INPUT | AUTO TRANSMITION OVERDRIVE REQUEST |
| GM | OD RQ/MT | SWITCH | INPUT | MANUAL TRANSMITION OVERDRIVE REQUEST |
| GM | O2 | BATT_GEN | INPUT | OXYGEN SENSOR |
| GM | O2 GND | GROUND | INPUT | OXYGEN SENSOR GROUND |
| GM | P/N | SWITCH | INPUT | PARK NEUTRAL |
| GM | P/AIR | SOLENOID | OUTPUT | PULSE AIR CONTROL VALVE |
| GM | PWRGND | GROUND | INPUT | POWER GROUND |
| GM | PS/SW | SWITCH | INPUT | POWER STEERING SWITCH |
| GM | RV/SW | SWITCH | OUTPUT | REVERSE GEAR SWITCH |
| GM | RVB | SOLENOID | OUTPUT | REAR VAC BREAK |
| GM | 2ND G | SWITCH | OUTPUT | SECOND GEAR |
| GM | SRV/ENG | WARN_LT | OUTPUT | CHECK ENG LAMP OUTPUT |
| GM | SER DTA | COM_LINK | OUTPUT | SERIAL DATA COMMUNICATION LINK |
| GM | SIG RTN | GROUND | OUTPUT | SIGNAL RETURN (SENSOR GROUND) |
| GM | SHFT LT | WARN_LT | INPUT | SHIFT INDICATOR LIGHT |
| GM | TAC SIG | FREQ_GEN | OUTPUT | TACH REFERENCE SIGNAL |
| GM | TCCS | RELAY | OUTPUT | TORQUE CONVERTER CLUTCH RELAY |
| GM | 3RD G | SWITCH | OUTPUT | THIRD GEAR |

| MAKE | NAME | TYPE | DIRECTION | DESCRIPTION |
|---|---|---|---|---|
| GM | 1ST G | SWITCH | OUTPUT | FIRST GEAR |
| GM | TH KCK | SOLENOID | OUTPUT | THROTTLE KICKER |
| GM | TPS | RESISTOR | INPUT | THROTTLE POSITION SENSOR |
| GM | TPS GND | GROUND | OUTPUT | THROTTLE POSITION SENSOR GROUND |
| GM | TPS/BU | SWITCH | INPUT | TRANSMISSION UNITS IN GENERAL |
| GM | TRANG | SWITCH | INPUT | TRANSMISSION UNITS IN GENERAL |
| GM | VATS | FREQ_GEN | INPUT | VEHICLE ANTI THEFT SYSTEM |
| GM | VAC | RESISTOR | INPUT | VACUUM SENSOR |
| GM | V/MON | POWER | INPUT | VOLTAGE MONITOR |
| GM | V/REG | POWER | INPUT | VOLTAGE REGULATOR |
| GM | VSS | FREQ_GEN | INPUT | VEHICLE SPEED SENSOR |
| GM | VSS GND | GROUND | OUTPUT | VEHICLE SPEED SENSOR GROUND |
| GM | VREF | POWER | OUTPUT | 5 VOLTS SENSOR REF |
| GM | VREF 8V | POWER | OUTPUT | 8 VOLT REFERENCE |
| FORD | ACC | RELAY | OUTPUT | AIR CONDITIONING CLUTCH CONTROL |
| FORD | AC CUT | RELAY | OUTPUT | AIR CONDITIONING CUTOUT CONTROL |
| FORD | AC ON | SWITCH | INPUT | AIR CONDITIONING STATUS |
| FORD | ACT | THERMISTOR | INPUT | AIR CHARGE TEMPERATURE SENSOR |
| FORD | BARO | PIEZO | INPUT | BAROMETRIC PRESSURE SENSOR |
| FORD | BARO | SWITCH | INPUT | BAROMETRIC PRESSURE SENSOR |
| FORD | BOO | SWITCH | INPUT | BRAKE ON/OFF SWITCH |
| FORD | CNAP | SOLENOID | OUTPUT | CANISTER PURGE SOLENOID |
| FORD | CFC | RELAY | OUTPUT | COOLANT FAN CONTROL |
| FORD | CK ENG | WARN_LT | OUTPUT | CHECK ENGINE LIGHT |
| FORD | CASE GND | GROUND | INPUT | ECA CASE GROUND |
| FORD | CID | FREQ_GEN | INPUT | CYLINDER ID SIGNAL |
| FORD | CLU OVR | SWITCH | INPUT | CLUTCH CONVERTER OVERRIDE SWITCH |
| FORD | CLU SW | SWITCH | INPUT | CLUTCH ON/OFF SWITCH |
| FORD | KAM | POWER | INPUT | KEEP ALIVE MEMORY |
| FORD | CP | HALL_SWITCH | INPUT | CRANKSHAFT POSITION SENSO |
| FORD | CP GND | GROUND | OUTPUT | CRANKSHAFT POSITION SENSOR GROUND |
| FORD | CRNK_SIG | BATT_GEN | INPUT | BATTERY VOLTAGE CRANKING SIGNAL |
| FORD | CRU SW | SWITCH | INPUT | CRUISE CONTROL SWITCH |
| FORD | DA LNK | COM_LINK | OUTPUT | DIAGNOSTIC DATA LINK |
| FORD | DPI | SWITCH | OUTPUT | DUAL PLUG INHIBITOR |
| FORD | DT SW | SWITCH | INPUT | DUAL TEMPERATURE SWITCH |
| FORD | ECT | THERMISTOR | INPUT | ENGINE COOLANT TEMPERATURE SENSOR |
| FORD | EDF | BATT_GEN | OUTPUT | ELECTRIC DRIVE FA |
| FORD | EEC RLY | RELAY | INPUT | EEC POWER RELAY |
| FORD | EGO | BATT_GEN | INPUT | EXHAUST GAS OXYGEN SENSOR |
| FORD | EGO GND | GROUND | OUTPUT | OXYGEN SENSOR GROUND |
| FORD | EGOR | BATT_GEN | INPUT | OXYGEN SENSOR (RIGHT SIDE) |
| FORD | EGOL | BATT_GEN | INPUT | OXYGEN SENSOR (LEFT SIDE) |
| FORD | EGOR GND | GROUND | OUTPUT | OXYGEN SENSOR GROUND (RIGHT SIDE) |
| FORD | EGOL GND | GROUND | OUTPUT | OXYGEN SENSOR GROUND (LEFT SIDE) |
| FORD | EGR C/O | SOLENOID | OUTPUT | EGR CUT OUT SOLENOID |
| FORD | EGR PFB | TRANSDUCER | INPUT | EGR PRESSURE FEEDBACK |
| FORD | EGRV | SOLENOID | OUTPUT | EGR VENT SOLENOID |
| FORD | EGRC | SOLENOID | OUTPUT | EGR CONTROL SOLENOID |
| FORD | EVR | SOLENOID | OUTPUT | EGR VAC REGULATOR SOLENOID |
| FORD | EVP | RESISTOR | OUTPUT | EGR VALVE POSITION SENSOR |
| FORD | EHC | RESISTOR | OUTPUT | EXHAUST HEAT CONTROL |
| FORD | FBC | STP_MOTOR | OUTPUT | FEEDBACK CARBURETOR ACTUATO |
| FORD | FCS | SOLENOID | OUTPUT | FUEL CONTROL SOLENOID |
| FORD | FP MON | RELAY | INPUT | FUEL PUMP VOLTAGE MONITOR |
| FORD | FP RLY | RELAY | OUTPUT | FUEL PUMP RELAY |
| FORD | TGR SW | SWITCH | INPUT | TRANSMISSION GEAR SWITCH INDICATOR |
| FORD | PWRGND | GROUND | INPUT | POWER GROUND TO ENGINE BLOCK |
| FORD | HEGO | BATT_GEN | INPUT | HEATED OXYGEN SENSOR |
| FORD | HEGOG | GROUND | INPUT | HEATED OXYGEN SENSOR GROUND |
| FORD | HEGOL | BATT_GEN | INPUT | HEATED OXYGEN SENSOR (LEFT SIDE) |
| FORD | HEGOR | BATT_GEN | INPUT | HEATED OXYGEN SENSOR (RIGHT SIDE) |
| FORD | HT WS | RELAY | OUTPUT | HEATED WINSHIELD RELAY |
| FORD | IGN GND | GROUND | INPUT | IGNITION GROUND (TFI MODULE) |
| FORD | IDM | COM_LINK | INPUT | IGNITION DIAGNOSTIC MONITOR |
| FORD | IMS | SWITCH | OUTPUT | IGNITION MODULE SIGNAL |
| FORD | INJ | SOLENOID | OUTPUT | INJECTOR DRIVER |
| FORD | IAS | SOLENOID | OUTPUT | INLET AIR SOLENIOD |
| FORD | ISC | STP_MOTOR | OUTPUT | IDLE SPEED CONTROL |
| FORD | AIR BP | SOLENOID | OUTPUT | AIR BYPASS SOLENOID (THROTTLE) |

| MAKE | NAME | TYPE | DIRECTION | DESCRIPTION |
|------|------|------|-----------|-------------|
| FORD | ITS | SWITCH | OUTPUT | IDLE TRACKING SWITCH |
| FORD | VEH PWR | POWER | INPUT | VEHICLE POWER (KEY ON) |
| FORD | KNK SEN | PIEZO | INPUT | KNOCK SENSOR SIGNAL |
| FORD | LTMP SW | SWITCH | INPUT | LOW TEMPERATURE SWITCH |
| FORD | MAF | FREQ_GEN | INPUT | MASS AIR FLOW SENSOR |
| FORD | MAF GND | GROUND | OUTPUT | MASS AIR FLOW SENSOR GROUND |
| FORD | MAP | PIEZO | INPUT | MANIFOLD ABSOLUTE PRESSURE SENSOR |
| FORD | MTEMP | SWITCH | INPUT | MID TEMPERATURE SWITCH |
| FORD | NS SW | SWITCH | OUTPUT | NEUTRAL START SWITCH |
| FORD | OCT SW | SWITCH | INPUT | OCTANE SWITCH |
| FORD | OD CNL | SWITCH | OUTPUT | OVERDRIVE CANCEL INDICATOR LIGHT |
| FORD | PSPS | SWITCH | INPUT | POWER STEERING PRESSURE SWITCH |
| FORD | PIP | FREQ_GEN | INPUT | PROFILE IGNITION PICK-UP |
| FORD | SHFT LT | WARN_LT | OUTPUT | SHIFT INDICATOR LIGHT |
| FORD | SIG RTN | GROUND | OUTPUT | SIGNAL RETURN (SENSOR GROUND) |
| FORD | SHFT 3&4 | SOLENOID | OUTPUT | SHIFT SOLENOID 3&4 |
| FORD | ST TRIG | DONT_KNOW | INPUT | SELF TEST TRIGGER |
| FORD | SPOUT | FREQ_GEN | OUTPUT | SPARK OUTPUT SIGNAL TO TFI MODULE |
| FORD | SPR SOL | SOLENOID | OUTPUT | SPARK RETARD SOLENOID |
| FORD | SCVNT | SOLENOID | OUTPUT | SPEED CONTROL SOLENOID |
| FORD | SPC GND | GROUND | OUTPUT | SPEED CONTROL GROUND |
| FORD | SCCS | SWITCH | INPUT | SPEED CONTROL COMMAND SWITCH |
| FORD | SC VAC | SOLENOID | OUTPUT | SPEED CONTROL VACUUM SOLENOID |
| FORD | SCVNT | SOLENOID | OUTPUT | SPEED CONTROL VENT SOLENOID |
| FORD | SRVT | TRANSDUCER | INPUT | SPEED CONTROL SERVO TRANSDUCER |
| FORD | STI | RESISTOR | INPUT | SELF TEST INPUT |
| FORD | SCS | SOLENOID | OUTPUT | SUPERCHARGE BYPASS SOLENOID |
| FORD | TAB | SOLENOID | OUTPUT | THERMACTOR AIR BYPASS SOLENOID |
| FORD | TCC | RELAY | OUTPUT | TORQUE CONVERTER CLUTCH |
| FORD | TAC SIG | FREQ_GEN | INPUT | TACH SIGNAL |
| FORD | TAD | SOLENOID | OUTPUT | THERMACTOR AIR DIVERTER SOLENOID |
| FORD | TD RLY | RELAY | OUTPUT | THERMACTOR DUMP RELAY |
| FORD | THRD GW | SWITCH | OUTPUT | THIRD GEAR SWITCH |
| FORD | TKS RLY | RELAY | OUTPUT | THROTTLE KICKER RELAY |
| FORD | TKS | SOLENOID | OUTPUT | THROTTLE KICKER SOLENOID |
| FORD | TO TMP | RESISTOR | INPUT | TRANSMISSION OIL TEMPERATURE SENSOR |
| FORD | TPS | RESISTOR | INPUT | THROTTLE POSITION SENSOR |
| FORD | TRAN 3&2 | SWITCH | INPUT | TRANSMISSION GEAR SWITCH 3&2 |
| FORD | TRAN 4&3 | SWITCH | INPUT | TRANSMISSION GEAR SWITCH 4&3 |
| FORD | TRN/SOL | SOLENOID | INPUT | TRANSMISSION LOCKUP SOLENOID |
| FORD | TRAN SW | SWITCH | INPUT | TRANSMISSION SWITCH |
| FORD | TTMP SW | SWITCH | INPUT | TRANSMISSION TEMPERATURE SWITCH |
| FORD | TRN/SOL | SOLENOID | INPUT | TRANSMISSION THROTTLE SOLENOID |
| FORD | VS LO | SWITCH | INPUT | VACUUM SWITCH LO |
| FORD | VS HI | SWITCH | INPUT | VACUUM SWITCH HI |
| FORD | VS MED | SWITCH | INPUT | VACUUM SWITCH MED |
| FORD | VAF | RESISTOR | INPUT | VANE AIR FLOW SENSOR |
| FORD | VVC | BATT_GEN | INPUT | VARIABLE VOLTAGE CHOKE |
| FORD | VAT | THERMISTOR | INPUT | VANE AIR TEMPERATURE SENSOR |
| FORD | VEH PWR | POWER | INPUT | VEHICLE POWER |
| FORD | VSS | FREQ_GEN | INPUT | VEHICLE SPEED SENSOR |
| FORD | VSS GND | GROUND | OUTPUT | VEHICLE SPEED SENSOR GROUND |
| FORD | VREF5 | POWER | OUTPUT | VOLTAGE REF (5 VOLT SENSOR INPUT) |
| FORD | VREF9 | POWER | OUTPUT | VOLTAGE REF (9 VOLT SENSOR INPUT) |
| FORD | WG CTRL | SOLENOID | OUTPUT | WASTEGATE SOLENOID CONTROL |
| FORD | WOT VAC | SWITCH | INPUT | WIDE OPEN THROTTLE VACUUM SWITCH |
| FORD | ZVAC | SWITCH | INPUT | ZONED VACUUM SWITCH |

```
/*****************************************************************/
/*   TABLE - 3 :   TESTS PERFORMED DURING THE SWEEP TEST:      */
/*****************************************************************/

KEY OFF ENG OFF TESTS:
    1) TEST VOLTAGE AT CONTINUOUS BATTERY PINS.
    2) TEST RESISTANCE OF POWER GROUNDS.
    3) TEST RESISTANCE OF THE IDLE AIR CONTROL STEPPER MOTOR.
    4) TEST RESISTANCE OF THE IDLE SPEED CONTROL DC REVERSIBLE MOTOR.

KEY ON ENG OFF TEST:
    1) TEST VOLTAGE AT KEY POWER PINS.
```

2) TEST VOLTAGE AT SYSTEM GROUND PINS.
3) TEST VOLTAGE AT SENSOR GROUND PINS.
4) TEST VOLTAGE AT VREF PINS.
5) TEST VOLTAGE OF TPS.
6) TEST VOLTAGE OF AIR TEMPERATURE SENSOR.
7) TEST VOLTAGE OF BARO SENSOR.
8) TEST VOLTAGE OF MANIFOLD AIR PRESSURE SENSOR.
9) TEST VOLTAGE OF MANIFOLD AIR FLOW SENSORE.
10) TEST VOLTAGE OF COOLANT TEMP SENSOR.
11) TEST VOLTAGE OF ALL SOLENOIDS.
12) TEST RESISTANCE OF ALL SOLENOIDS.
13) TEST VOLTAGE OF ALL INJECTORS.
14) TEST RESISTANCE OF ALL INJECTORS.

CRANKING TEST:
1) TEST RPM DURING CRANKING.
2) TEST FUEL PUMP OPERATION DURING CRANKING.
3) TEST MANIFOLD AIR PRESSURE DURING CRANKING.
4) TEST MANIFOLD AIR FLOW DURING CRANKING.
5) TEST CYLINDER ID SIGNAL DURING CRANKING.
6) TEST VOLTAGE DROP IN CONTINUOUS BATTERY PINS AFTER CRANKING.
6) TEST VOLTAGE DROP IN KEY POWER PINS AFTER CRANKING.

EDGE DIAGNOSTICS - CONNECTION-1
SWEEP TEST REPORT

SOFTWARE VERSION: MG R1.07.26 , HARNESS: GM_05

VEHICLE : GM 1989, VIN 7   V6 3.8L SFI  TURBO , DATE: 01/22/91 11:54 AM

| NUM | PIN | FUNCTION | MIN | MAX | UNITS | ACTUAL | STATUS |
|---|---|---|---|---|---|---|---|
| | | KEY OFF ENGINE OFF TESTS: | | | | | |
| 1 | C16 | CON BATT | B- | B+ | VOLT | | na |
| 2 | A12 | PWRGND | 0.00 | 5.00 | OHM | | na |
| 3 | B3 | IGN GND | 0.00 | 5.00 | OHM | | na |
| 4 | D1 | PWRGND | 0.00 | 5.00 | OHM | | na |
| 5 | D10 | PWRGND | 0.00 | 5.00 | OHM | | na |
| 6 | C3 | IACB LO | 20.00 | 100.0 | OHM | | na |
| 7 | C6 | IACA LO | 20.00 | 100.0 | OHM | | na |
| | | KEY ON ENGINE OFF TESTS: | | | | | |
| 9 | A6 | KEY PWR | B- | B+ | VOLT | | na |
| 10 | A12 | PWRGND | 0.00 | 0.20 | VOLT | | na |
| 11 | B3 | IGN GND | 0.00 | 0.20 | VOLT | | na |
| 12 | D1 | PWRGND | 0.00 | 0.20 | VOLT | | na |
| 13 | D10 | PWRGND | 0.00 | 0.20 | VOLT | | na |
| 14 | D6 | O2 LO | 0.00 | 0.20 | VOLT | | na |
| 15 | D12 | SIG RTN | 0.00 | 0.20 | VOLT | | na |
| 16 | C14 | VREF | 4.20 | 5.40 | VOLT | | na |
| 17 | C13 | TPS | 0.45 | 5.00 | VOLT | | na |
| 18 | C11 | MAT | 0.00 | 5.50 | VOLT | | na |
| 19 | C10 | CTS | 0.00 | 5.50 | VOLT | | na |
| 20 | B6 | MAF | na | na | HZ | | na |
| 21 | D7 | O2 | 0.15 | 0.80 | VOLT | | na |
| 22 | A3 | CAN PURG | B- | B+ | VOLT | | na |
| 23 | A3 | CAN PURG | 20.00 | 100.0 | OHM | | na |
| 24 | A4 | EGR PWM | B- | B+ | VOLT | | na |
| 25 | B12 | INJ 5 | B- | B+ | VOLT | | na |
| 26 | B12 | INJ 5 | 11.00 | 18.00 | OHM | | na |
| 27 | C12 | INJ 6 | B- | B+ | VOLT | | na |
| 28 | C12 | INJ 6 | 11.00 | 18.00 | OHM | | na |
| 29 | C15 | INJ 2 | B- | B+ | VOLT | | na |
| 30 | C15 | INJ 2 | 11.00 | 18.00 | OHM | | na |
| 31 | D3 | WST/G | B- | B+ | VOLT | | na |
| 32 | D14 | INJ 1 | B- | B+ | VOLT | | na |
| 33 | D14 | INJ 1 | 11.00 | 18.00 | OHM | | na |
| 34 | D15 | INJ 3 | B- | B+ | VOLT | | na |
| 35 | D15 | INJ 3 | 11.00 | 18.00 | OHM | | na |
| 36 | D16 | INJ 4 | B- | B+ | VOLT | | na |
| 37 | D16 | INJ 4 | 11.00 | 18.00 | OHM | | na |

What is claimed is:

1. For use in a diagnostic system for an automotive vehicle of the type having (i) network sensors and actuators for independently sensing and actuating a number of different functions within the vehicle (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, an arrangement for temporarily disconnecting a selected one or a combination of said auto-side terminals from corresponding computer-side terminals, whereby to temporarily disconnect a selected one or combination of specific sensors and/or actuators rom said outboard computer, said arrangement comprising:

(a) a plurality of electronic switching circuits including a first network of such circuits individually connected between individual auto-side an computer-side terminals and a second network of such circuits connectable between an external computer arrangement and either individual auto-side or computer-side terminals, each of said switching circuits being designed to operated between a closed condition and an open condition for connecting and disconnecting its associated auto-side and computer-side terminals to and from one another and for connecting and disconnecting the external computer arrangement to an associated auto-side or computer-side terminal, said networks of circuits being designed for use with a particular make and/or model of said automotive vehicle in which its auto-side and computer-side terminals are connected with particular sensors and actuators in accordance with a specific connection scheme which differs from a different make and/or model vehicle.

2. An interactive diagnostic system for an automotive vehicle of the type having (i) a network of sensors and actuators for independently sensing and actuating a number of different functions within the vehicle, (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, said diagnostic system comprising:

(a) first means for temporarily disconnecting a selected one or combination of said auto-side terminals from corresponding computer-side-terminals, whereby to temporarily disconnect a selected one or combination of specific sensors and/or actuators form said onboard computer, said first means including a network of switching circuits individually connected between auto-side and computer-side terminals, each of said switching circuits being designed to operate independent of but simultaneously with the other circuits in any selected combination between a closed condition and an open condition for connecting and disconnecting its associated auto-side and computer-side terminals to and from one another;

(b) second means temporarily connectable with said one or combination of auto-side terminals when the latter are disconnected from their corresponding computer-die terminals for controlling the operation of said one or combination of specific actuators independent of said onboard computer; and (c) third means temporarily connectable with said one or combination of computer-side terminals when the latter are disconnected from their corresponding auto-side terminals for simulating the operation of said one or combination of specific sensors independent of the actual operation of these latter sensors.

3. A system according to claim 2 wherein said second means includes an external computer arrangement separate from said onboard computer for controlling the operation of said one or combination of specific actuators independent of said onboard computer by generating specific information digitally, converting said digital information to analog signals and directing said analog signals to said one or combination of specific actuators through said one or combination of auto-side terminals.

4. A system according to claim 3 wherein said third means includes said external computer arrangement separate from said onboard computer for simulating the operation of said one or combination of specific sensors independent of the actual operation of these latter sensors by generating specific signals digitally from said external computer, converting said digital signals to analog information and directing said analog information to the appropriate circuitry within said onboard computer through said one or combination of computer-side terminals.

5. A system according to claim 4 wherein said network of switching circuits are electronic switching circuits and wherein each of said second and third means includes a network of electronic switching circuits individually connected between said external computer arrangement and individual auto-side or computer-side terminals, each of said switching circuits being designed to operate between a closed condition and an open condition for connecting and disconnecting the external computer arrangement to its associated auto-side or computer-side terminals.

6. A system according to claim 5 wherein the first mentioned network of switches forming part of said first means also serves as the network of switches forming part of said second and third means.

7. A system according to claim 5 wherein said computer arrangement includes means for operating said networks of electronic switching circuits individually or in selected combinations.

8. A system according to claim 4 wherein different vehicle makes and/or models compatible with said system may include different sensors and/or actuators, a different onboard computer and/or a different arrangement of auto-side and computer-side terminals, and wherein said external computer arrangement includes a data base for distinguishing between any of said differences in different vehicle makes and models.

9. A system according to claim 8 wherein said external computer arrangement includes a visual display for visually displaying information from said external computer arrangement.

10. A system according to claim 9 wherein said external computer arrangement includes a database for appropriately scaling visually displayed graphic data depending on the vehicle being diagnosed, and the electrical parameters of the sensor/actuator connected to the terminal pin or pins being acted upon.

11. A system according to claim 8 wherein said database includes performance information pertaining to specific sensors and actuators for particular vehicle makes and models.

12. A system according to claim 2 including means for continually monitoring in real time electronic data entering and/or exiting said onboard computer including actual data associated with said network of sensors and actuators.

13. A system according to claim 12 wherein said monitoring means includes an external computer arrangement separate from said onboard computer for analyzing said electronic data.

14. A system according to claim 13 wherein said computer includes means for storing said electronic data into memory, a data base having exemplary data associated with said network of sensors and actuators, and means for comparing the actual data stored in memory with said exemplary data.

15. A system according to claim 12 including an external computer arrangement separate from said onboard computer forming part of said second means, third means, and said monitoring means for
   (a) controlling the operation of said one or more specific actuators independent of said onboard computer,
   (b) simulating the operation of said one or more specific sensors independent of the actual operation of the latter sensors, and/or
   (c) analyzing said electronic data.

16. A system according to claim 15 wherein said external computer arrangement includes means for causing said second, third, and monitoring means to automatically operate in a predetermined way to carry out different predetermined tests on said network of sensors and actuators.

17. A diagnostic system for an automotive vehicle of the type having (i) a network of sensors and actuators for independently sensing and actuating a number of different functions within the vehicle (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, said diagnostic system comprising:
   (a) monitoring means including a network of individual circuits disengageably connectable with and between said auto-side and computer-side terminals for independently and substantially simultaneously monitoring in real time individual electronic data entering and exiting said onboard computer through said individual circuits the individual data being associated with the individual sensors and actuators making up said network of sensors and actuators, said monitoring means also include an external computer arrangement separate from said onboard computer for analyzing said electronic data.

18. A system according to claim 17 wherein said computer arrangement includes means for storing said electronic data into memory, a database having exemplary data associated with said network of sensors and actuators, and means for comparing the actual data stored in memory with said exemplary data.

19. A system according to claim 17 wherein different vehicle makes and/or models compatible with said system may include different sensors and/or actuators, different onboard computers and/or different arrangement of auto-side and computer-side terminals, and wherein said external computer arrangement includes a database for distinguishing between any of said differences in different vehicle makes and/or models.

20. The system according to claim 19 wherein said database includes performance information pertaining to specific sensors and actuators for particular vehicle makes and models.

21. The system according to claim 20 including:
   (a) first means for selectively and temporarily disconnecting one or more of said auto-side terminals from corresponding computer-side terminals, whereby to selectively and temporarily disconnect one or more specific sensors and/or actuators from said onboard computer;
   (b) second means temporarily connectable with said one or more specific auto-side terminals when the latter are disconnected from their corresponding computer-side terminals for controlling the operation of said one or more actuators independent of said onboard computer; and
   (c) third means temporarily connectable with said one or more specific computer-side terminals when the latter are disconnected from their corresponding auto-side terminals for simulating the operation of said one or more specific sensors independent of the actual operation of these latter sensors.

22. A system according to claim 21 wherein said external computer arrangement forms part of said second and third means for controlling the operation of said one or more specific actuators independent of said onboard computer and for simulating the operation of said one or more specific sensors independent of the actual operation of these latter sensors.

23. A system according to claim 17 wherein said network of individual circuits is designed for use with a particular make and/or model of said automotive vehicle in which its auto-side and computer-side terminals are connected with particular sensors and actuators in accordance with a specific connection scheme which differs form a different make and/or model vehicle.

24. A system according to claim 23 wherein said monitoring means includes a second network of individual circuits disengageably connectable with and between said auto-side and computer-side terminals, said second network corresponding in function to said first-mentioned network of circuits but specifically for said different and/or model vehicle.

25. A method of diagnosing for an automotive vehicle of the type having (i) a network of sensors and actuators for independently sensing and actuating a number of different functions within the vehicle (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, said method comprising the steps of:

(a) using an arrangement of independently actuatable switches disengageably connected with said auto-side and computer-side terminals, (i) temporarily and simultaneously disconnecting selected ones of said auto-side terminals from corresponding computer-side terminals arrangement, and (iii) connections elected ones of the disconnected auto-side terminals to an external computer arrangement, and (iii) connecting selected others of the disconnected computer-side terminals to said computer arrangement, in order to selectively and temporarily disconnect one or more specific sensors and/or actuators from said onboard computer; and (b) through said arrangement of switches, controlling the operation of said one or more specific disconnected actuators by said external computer arrangement through the selected, disconnected auto-side terminals, independent of said onboard computer and/or simulating operation of said one or more specific disconnected sensors by said external computer arrangement through the selected disconnected computer-side terminals, independent of the actual operation of those sensors.

26. A method according to claim 25 including the step of continuously monitoring in real time electronic data entering and/or exiting said onboard computer including actual data associated with said network of sensors and actuators through said arrangement of switches.

27. A method according to claim 26 wherein said external computer arrangement is used to control the operation of said specific actuators, to simulate the operation of said specific sensors, and to analyze the electronic data entering and/or exiting said onboard computer continuously monitored through said arrangement of switches.

28. A method according to claim 27 wherein different vehicle makes and/or models compatible with said method may include different sensors and/or actuators, different onboard computers and/or a different arrangement of auto-side and computer-side terminals, said method including the steps of providing a database in said external computer for distinguishing between any of said differences in said vehicle makes and/or models and for providing a different arrangement of switches for different vehicle makes and/or models.

29. A method according to claim 28 including the step of providing said external computer with a database including performance information pertaining to specific sensors and actuators for particular vehicle makes and/or models.

30. A diagnostic system for an automotive vehicle of the type having (i) network of sensors and actuators for independently sensing and actuating a number of different functions with the vehicle (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, said diagnostic system comprising:

(a) controlling, simulating and monitoring means for (i) controlling the operation of one or a combination of said actuators independent of said onboard computer, (ii) for simulating the operation of one or a combination of said sensors independent of the actual operation of the latter sensors, and/or (iii) for continuously monitoring in real time electronic data entering and exiting said onboard computer, which data is associated with one, all or selectable combinations of said network of sensors and actuators, said controlling, simulating and monitoring means also including an external computer arrangement separate from said onboard computer for analyzing said electronic data.

31. A system according to claim 30 wherein said network of individual circuits is designed for use with a particular make and/or model of said automotive vehicle in which its auto-side and computer-side terminals are connected with particular sensors and actuators in accordance with a specific connection scheme which differs from a different make and/or model vehicle.

32. A system according to claim 31 wherein said monitoring means includes a second network of individual circuits disengageably connectable with and between said auto-side and computer-side terminals, said second network corresponding in function to said first-mentioned network of circuits but specifically for said different make and/or model vehicle.

* * * * *

US005214582C1

(12) REEXAMINATION CERTIFICATE (4381st)
United States Patent
Gray

(10) Number: US 5,214,582 C1
(45) Certificate Issued: Jun. 26, 2001

(54) INTERACTIVE DIAGNOSTIC SYSTEM FOR AN AUTOMOBILE VEHICLE, AND METHOD

(75) Inventor: Moshe Gray, Los Altos Hills, CA (US)

(73) Assignee: Edge Diagnostic Systems, Sunnyvale, CA (US)

Reexamination Request:
No. 90/005,146, Oct. 9, 1998

Reexamination Certificate for:
Patent No.: 5,214,582
Issued: May 25, 1993
Appl. No.: 07/647,774
Filed: Jan. 30, 1991

(51) Int. Cl.[7] .................................................. G06F 7/00
(52) U.S. Cl. .............................. 701/33; 701/32; 701/31; 701/29; 701/114; 340/439; 73/117.3; 702/182
(58) Field of Search .............................. 701/29, 33, 34, 701/35, 31, 102, 32; 73/118.1, 117.3, 116, 117.2; 702/183, 120, 122, 119, 121, 182; 340/438, 439, 436

(56) References Cited

U.S. PATENT DOCUMENTS

| Re. 29,984 | 5/1979 | Howes | 73/117.3 |
|---|---|---|---|
| Re. 31,656 | 9/1984 | Howes | 73/117.3 |
| 3,551,800 | 12/1970 | Widmer | 324/15 |
| 3,713,331 | 1/1973 | Petersen et al. | 73/117.2 |
| 3,765,009 | 10/1973 | Graves et al. | 340/324 |
| 3,789,658 | 2/1974 | Olsen | 73/117.3 |
| 3,878,984 | 4/1975 | Sotiropoulos et al. | 235/151.32 |
| 3,906,437 | 9/1975 | Brandwein et al. | 340/27 |
| 3,924,078 | 12/1975 | Bussey | 179/15 |
| 3,942,102 | 3/1976 | Kuhn et al. | 324/16 |

(List continued on next page.)

FOREIGN PATENT DOCUMENTS

| 2057046 | 12/1990 | (CA). | |
|---|---|---|---|
| 32 09 803 | 4/1981 | (DE) | G06F/3/00 |
| 35 00 086 | 3/1985 | (DE) | G01R/13/20 |
| 0 579 959 | 6/1993 | (DE) | G01R/19/04 |
| 0 065 703 | 12/1982 | (EP). | |
| 0 090 756 | 6/1986 | (EP). | |
| 0 194 128 | 4/1986 | (GB). | |
| 2 210 998 | 6/1989 | (GB) | G05B/13/02 |
| 2 213 608 | 8/1989 | (GB). | |
| 2 216 291 | 10/1989 | (GB). | |
| 86/06190 | 10/1986 | (WO). | |
| 90/15316 | 12/1990 | (WO). | |

OTHER PUBLICATIONS

Sun Electric, Sun–1218 DMS Card Reader Operating Instructions, 1981, USA.
Sun Electric, Sun–2013, STL–2013 Service Manual, 1990, USA.

(List continued on next page.)

*Primary Examiner*—Jacques H. Louis-Jacques

(57) ABSTRACT

An interactive diagnostic system is disclosed herein for use with an automotive vehicle of the type including a network of sensors and actuators for independently sensing and actuating a number of different functions within the vehicle and an onboard computer for monitoring the sensors and controlling the operation of the actuators. This system provides the automotive service professional with all of the tools necessary to provide precision diagnostic testing on todays computer-controlled cars. This is accomplished by providing the system with means including an external computer for controlling operation of one or more specific actuators independent of the onboard computer and for simulating the operation of specific sensors independent of the actual operation of these latter sensors. At the same time, the electronic data entering and exiting the onboard computer including the actual data associated with the network of sensors and actuators can be continuously monitored and analyzed by the external computer. In this way, the automotive service professional is able to quickly and easily test and trouble shoot the performance of a vehicle's onboard computer and engine electronics down to the component level including specifically its entire network of sensors and actuators.

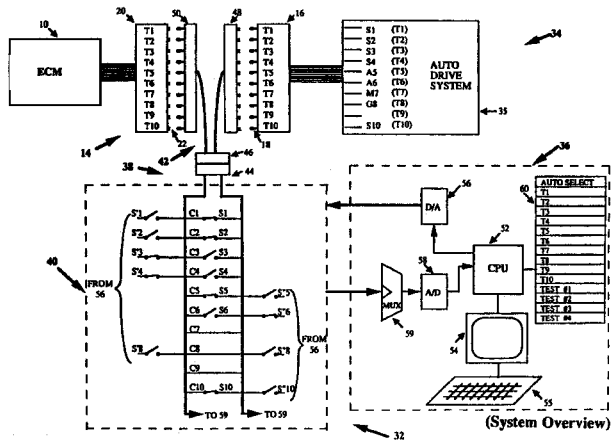

(System Overview)

U.S. PATENT DOCUMENTS

| | | | |
|---|---|---|---|
| 3,973,197 | 8/1976 | Meyer | 324/103 |
| 3,990,302 | 11/1976 | Reeves et al. | 73/116 |
| 4,004,213 | 1/1977 | Kato et al. | 324/15 |
| 4,006,403 | 2/1977 | Olsen et al. | 324/15 |
| 4,006,413 | 2/1977 | Silberberg | 324/103 |
| 4,039,784 | 8/1977 | Quarton et al. | 235/151 |
| 4,050,297 | 9/1977 | Pettingell et al. | 73/117.2 |
| 4,053,823 | 10/1977 | Adamian | 324/17 |
| 4,055,995 | 11/1977 | Armstrong et al. | 73/116 |
| 4,062,232 | 12/1977 | Sutphin, Jr. | 73/117.2 |
| 4,072,851 | 2/1978 | Rose | 364/487 |
| 4,125,894 | 11/1978 | Cashel et al. | 701/123 |
| 4,128,005 | 12/1978 | Arnston et al. | 73/117.3 |
| 4,135,246 | 1/1979 | McMannis | 364/551 |
| 4,143,365 | 3/1979 | Cayzac et al. | 340/347 |
| 4,145,746 | 3/1979 | Trussell et al. | 364/551 |
| 4,145,754 | 3/1979 | Utzerath | 364/900 |
| 4,149,096 | 4/1979 | Holzner et al. | 307/115 |
| 4,175,264 | 11/1979 | Schiff | 340/747 |
| 4,199,729 | 4/1980 | Durand et al. | 328/151 |
| 4,208,626 | 6/1980 | Gregg, Jr. | 324/77 |
| 4,234,921 | 11/1980 | Kinoshita et al. | 701/99 |
| 4,251,815 | 2/1981 | Dagostino | 340/722 |
| 4,258,421 | 3/1981 | Juhasz et al. | 364/424 |
| 4,267,569 | 5/1981 | Baumann et al. | 364/431 |
| 4,271,486 | 6/1981 | Dagostino et al. | 365/45 |
| 4,291,383 | 9/1981 | Tedeschi et al. | 364/551 |
| 4,295,363 | 10/1981 | Buck et al. | 73/117.3 |
| 4,300,205 | 11/1981 | Tansuwan | 364/578 |
| 4,331,029 | 5/1982 | Wilson | 73/117.3 |
| 4,370,646 | 1/1983 | Mahony | 340/722 |
| 4,375,672 | 3/1983 | Kato et al. | 701/102 |
| 4,379,263 | 4/1983 | Everett et al. | 324/379 |
| 4,383,440 | 5/1983 | Murata | 73/117.3 |
| 4,394,742 | 7/1983 | Crummer et al. | 364/487 |
| 4,396,888 | 8/1983 | Everett et al. | 324/379 |
| 4,399,407 | 8/1983 | Kling et al. | 324/379 |
| 4,404,639 | 9/1983 | McGuire et al. | 364/551 |
| 4,417,467 | 11/1983 | Higgs et al. | 73/117.3 |
| 4,418,388 | 11/1983 | Allgor et al. | 364/431.01 |
| 4,424,709 | 1/1984 | Meier, Jr. et al. | 73/117.3 |
| 4,470,016 | 9/1984 | Palmer | 324/402 |
| 4,472,779 | 9/1984 | Marino et al. | 364/431.01 |
| 4,476,531 | 10/1984 | Marino et al. | 364/431.01 |
| 4,477,803 | 10/1984 | Conrad | 340/722 |
| 4,480,271 | 10/1984 | Coleman, Jr. | 358/310 |
| 4,502,324 | 3/1985 | Marino et al. | 73/117.3 |
| 4,532,593 | 7/1985 | Mouri et al. | 701/114 |
| 4,532,594 | 7/1985 | Hosaka et al. | 701/114 |
| 4,536,760 | 8/1985 | Navarro et al. | 340/722 |
| 4,551,801 | 11/1985 | Sakol | 701/32 |
| 4,558,280 | 12/1985 | Koehl et al. | 324/399 |
| 4,562,728 | 1/1986 | Timmerman | 73/116 |
| 4,567,756 | 2/1986 | Colborn | 73/118.1 |
| 4,585,990 | 4/1986 | Murphy | 324/102 |
| 4,602,127 | 7/1986 | Neely et al. | 179/2 |
| 4,623,976 | 11/1986 | Carp et al. | 702/90 |
| 4,624,009 | 11/1986 | Glenn et al. | 381/43 |
| 4,634,895 | 1/1987 | Luong | 307/350 |
| 4,690,475 | 9/1987 | McElroy | 439/502 |
| 4,694,408 | 9/1987 | Zaleski | 701/33 |
| 4,747,301 | 5/1988 | Bellanger | 73/117.3 |
| 4,748,843 | 6/1988 | Schafer et al. | 701/35 |
| 4,757,463 | 7/1988 | Ballou et al. | 701/35 |
| 4,777,629 | 10/1988 | Morris et al. | 367/69 |
| 4,779,028 | 10/1988 | Blair | 315/367 |
| 4,783,991 | 11/1988 | Wixon | 73/117.3 |
| 4,787,053 | 11/1988 | Moore | 364/551.01 |
| 4,796,206 | 1/1989 | Boscove et al. | 364/551.01 |
| 4,797,936 | 1/1989 | Nakatsugawa et al. | 382/1 |
| 4,804,921 | 2/1989 | Putrow et al. | 324/394 |
| 4,809,189 | 2/1989 | Batson | 364/487 |
| 4,812,768 | 3/1989 | Quinn | 324/379 |
| 4,812,979 | 3/1989 | Hermann et al. | 364/431.01 |
| 4,812,996 | 3/1989 | Stubbs | 364/487 |
| 4,816,813 | 3/1989 | Furno et al. | 340/724 |
| 4,821,217 | 4/1989 | Jackson et al. | 701/3 |
| 4,827,259 | 5/1989 | Murphy et al. | 341/123 |
| 4,831,560 | 5/1989 | Zaleski | 701/33 |
| 4,841,456 | 6/1989 | Hogan, Jr. et al. | 702/119 |
| 4,853,850 | 8/1989 | Krass, Jr. et al. | 701/35 |
| 4,862,371 | 8/1989 | Maekawa | 701/114 |
| 4,891,634 | 1/1990 | Ina et al. | 340/723 |
| 4,896,104 | 1/1990 | Patel et al. | 324/103 |
| 4,910,678 | 3/1990 | Kubozono et al. | 701/35 |
| 4,924,307 | 5/1990 | Landowski et al. | 358/107 |
| 4,926,330 | 5/1990 | Abe et al. | 364/424.03 |
| 4,928,105 | 5/1990 | Langner | 342/192 |
| 4,975,846 | 12/1990 | Abe et al. | 701/32 |
| 4,980,845 | 12/1990 | Govekar | 364/550 |
| 5,003,477 | 3/1991 | Abe et al. | 701/33 |
| 5,028,914 | 7/1991 | Povenmire | 340/720 |
| 5,034,889 | 7/1991 | Abe | 364/424.04 |
| 5,034,893 | 7/1991 | Fisher | 364/431.01 |
| 5,039,937 | 8/1991 | Mandt et al. | 324/121 |
| 5,041,976 | 8/1991 | Marko et al. | 364/424.03 |
| 5,050,080 | 9/1991 | Abe | 701/35 |
| 5,056,023 | 10/1991 | Abe | 364/424.03 |
| 5,066,909 | 11/1991 | Firooz | 324/158 |
| 5,077,670 | 12/1991 | Takai et al. | 364/424.03 |
| 5,081,592 | 1/1992 | Jenq | 364/487 |
| 5,093,872 | 3/1992 | Tutt | 382/56 |
| 5,109,437 | 4/1992 | Honda | 382/56 |
| 5,109,438 | 4/1992 | Alves et al. | 382/56 |
| 5,119,315 | 6/1992 | Kemp et al. | 364/498 |
| 5,124,919 | 6/1992 | Kastelle | 701/29 |
| 5,129,722 | 7/1992 | Mader et al. | 356/73.1 |
| 5,132,909 | 7/1992 | Schroeder et al. | 364/431.03 |
| 5,150,461 | 9/1992 | Reynolds | 395/164 |
| 5,159,438 | 10/1992 | Rabii | 358/12 |
| 5,160,892 | 11/1992 | Makhija et al. | 324/379 |
| 5,175,501 | 12/1992 | Loewe et al. | 324/380 |
| 5,208,871 | 5/1993 | Eschbach | 382/41 |
| 5,218,302 | 6/1993 | Loewe et al. | 324/380 |
| 5,237,313 | 8/1993 | Paxton et al. | 340/735 |
| 5,250,935 | 10/1993 | Jonker et al. | 345/134 |
| 5,255,208 | 10/1993 | Thakore et al. | 364/551.01 |
| 5,258,753 | 11/1993 | Jonker et al. | 345/140 |
| 5,262,871 | 11/1993 | Wilder et al. | 358/213.11 |
| 5,270,695 | 12/1993 | Chapman et al. | 345/131 |
| 5,272,545 | 12/1993 | Mita | 358/464 |
| 5,296,869 | 3/1994 | Jonker et al. | 345/24 |
| 5,303,313 | 4/1994 | Mark et al. | 382/56 |
| 5,333,615 | 8/1994 | Craelius et al. | 128/696 |
| 5,335,295 | 8/1994 | Ferracini et al. | 382/47 |
| 5,335,296 | 8/1994 | Larkin et al. | 382/47 |
| 5,347,478 | 9/1994 | Suzuki et al. | 364/715.02 |
| 5,365,254 | 11/1994 | Kawamoto | 345/157 |
| 5,371,842 | 12/1994 | Easton et al. | 395/140 |
| 5,375,067 | 12/1994 | Berchin | 364/487 |
| 5,387,870 | 2/1995 | Knapp et al. | 324/379 |
| 5,396,427 | 3/1995 | Piehl et al. | 364/431.04 |
| 5,397,981 | 3/1995 | Wiggers | 324/121 |
| 5,410,616 | 4/1995 | Kidd | 382/47 |
| 5,414,635 | 5/1995 | Ohta | 364/481 |
| 5,444,459 | 8/1995 | Moriyasu | 345/133 |
| 5,444,832 | 8/1995 | Suzuki | 395/132 |
| 5,481,193 | 1/1996 | Mueller et al. | 324/379 |
| 5,491,631 | 2/1996 | Shirane et al. | 364/424.04 |
| 5,495,168 | 2/1996 | De Vries | 324/121 |
| 5,506,772 | 4/1996 | Kubozono et al. | 701/29 |

| | | |
|---|---|---|
| 5,517,105 | 5/1996 | Holzwarth .......................... 324/121 |
| 5,614,828 | 3/1997 | Sims .................................. 324/402 |
| 5,680,311 | 10/1997 | Trsar et al. ...................... 364/431.03 |
| 5,684,507 | 11/1997 | Rasnake et al. ...................... 345/134 |
| 5,684,508 | 11/1997 | Brilman ................................ 345/134 |
| 5,742,276 | 4/1998 | Taraki ................................ 345/134 |
| 5,757,357 | 5/1998 | Grande et al. ...................... 345/134 |

OTHER PUBLICATIONS

Sun Electric, Sun–2013, Schematic for "T–Connector" 1979, BMW–2013 Service Tester Manual.

Shane Rachedi and Leonard Tedesco, Development of Diagnostic Tools in Automotive Electronics, Aug. 10, 1987, SAE 1987.

James Zeleski and Claude Perkins, TECH 1 Interactive Diagnostic Tester, Aug. 4, 1986, SAE 1986.

L.S. Tedesco, Service Bay Diagnostic System, Oct. 30, 1986, pp. 29–32, Ford Motor Co.

Ralph Carp, Russell Wakeman and Harold Weissler, A Low–Cost Interactive Diagnostic Tester, Feb. 25, 1985. SAE 1985.

Anne Watson Swager, Crosspoint–switch ICs enter digital domain, Feb. 16, 1989. EDM Magazine.

S. Mizutani and T. Ohtake, Automotive Electronics in Japan—the next five years, 1985.

G. Delagrange, J.M. Le Labourer, R. Brebion, Controle de statians de diagnostic automobile par un testeur economique, Jun. 11, 1989.

Tsunglun Yu and Giorgia Rizzoni, A Processor Architecture for Real–Time Fault Detection and Isolation in Electronically Controlled Diesel Engines, Jul. 1991.

Sun Electric Corporation, Annual Report 1979.

"BMW Service Test BMW Service for the 1980's".

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 2–32 is confirmed.

Claim 1 is determined to be patentable as amended.

1. For use in a diagnostic system for an automotive vehicle of the type having (i) network sensors and actuators for independently sensing and actuating a number of different functions within the vehicle (ii) an onboard computer for monitoring said sensors and controlling the operation of said actuators, and (iii) means for electrically connecting said onboard computer with said sensors and actuators, said connecting means including an auto-side connector having a series of auto-side plug-in terminals respectively connected with individual ones of said sensors and actuators and a computer-side connector disengageably connectable to said auto-side connector and having corresponding, complementary computer-side plug-in terminals connected to appropriate circuitry within the onboard computer, an arrangement for temporarily disconnecting a selected one or a combination of said auto-side terminals from corresponding computer-side terminals, whereby to temporarily disconnect a selected one or combination of specific sensors and/or actuators [rom] *from* said [outboard] *onboard* computer, said arrangement comprising:

(a) a plurality of electronic switching circuits including a first network of such circuits individually connected between individual auto-side [an] *and* computer-side terminals and a second network of such circuits connectable between an external computer arrangement and [either] *both* individual auto-side [or] *and* computer-side terminals, each of said switching circuits being designed to [operated] *operate* between a closed condition and an open condition for connecting and disconnecting its associated auto-side and computer-side terminals to and from one another and for connecting and disconnecting the external computer arrangement to an associated auto-side or computer-side terminal, said networks of circuits being designed for use with a particular make and/or model of said automotive vehicle in which its auto-side and computer-side terminals are connected with particular sensors and actuators in accordance with a specific connection scheme which differs from a different make and/or model vehicle.

* * * * *